US008116072B2

(12) United States Patent
Kagan et al.

(10) Patent No.: US 8,116,072 B2
(45) Date of Patent: Feb. 14, 2012

(54) CURRENT INPUTS INTERFACE FOR AN ELECTRICAL DEVICE

(75) Inventors: Erran Kagan, Great Neck, NY (US); Tibor Banhegyesi, Baldwin, NY (US); Avi Cohen, Great Neck, NY (US)

(73) Assignee: Electro Industries/Gauge Tech, Westbury, NY (US)

( * ) Notice: Subject to any disclaimer, the term of this patent is extended or adjusted under 35 U.S.C. 154(b) by 0 days.

(21) Appl. No.: 12/614,612

(22) Filed: Nov. 9, 2009

(65) Prior Publication Data

US 2010/0057387 A1 Mar. 4, 2010

Related U.S. Application Data

(63) Continuation of application No. 12/271,360, filed on Nov. 14, 2008, now Pat. No. 7,616,433, which is a continuation of application No. 11/894,931, filed on Aug. 22, 2007, now Pat. No. 7,453,684, which is a continuation of application No. 11/003,064, filed on Dec. 3, 2004, now Pat. No. 7,271,996.

(51) Int. Cl.
*G06F 19/00* (2006.01)

(52) U.S. Cl. ........ 361/664; 361/659; 361/663; 361/668; 702/60

(58) Field of Classification Search ............... 361/601, 361/659–669, 62, 79, 86, 88, 603, 673; 702/60, 702/61, 62, 64, 187, 189; 324/76.11, 103 R, 324/142, 127, 117 H, 114, 117 R, 76.12, 324/116, 141, 134; 340/870.02, 870.03
See application file for complete search history.

(56) References Cited

U.S. PATENT DOCUMENTS

| 3,584,299 | A | * | 6/1971 | Csete ............................ 324/86 |
| 3,737,891 | A | | 6/1973 | Metcalf |
| 4,158,810 | A | | 6/1979 | Leskovar |
| 4,161,720 | A | * | 7/1979 | Bogacki .................. 340/870.03 |
| 4,215,697 | A | | 8/1980 | Demetrescu |
| 4,225,839 | A | | 9/1980 | Martincic |
| 4,255,707 | A | | 3/1981 | Miller |
| 4,258,348 | A | | 3/1981 | Belfer et al. |
| 4,288,768 | A | | 9/1981 | Arnhold et al. |

(Continued)

FOREIGN PATENT DOCUMENTS

WO WO0101157 1/2001

OTHER PUBLICATIONS

7700 Ion 3-Phase Power Meter, Analyzer and Controller, pp. 1-8, Nov. 30, 2000.

(Continued)

*Primary Examiner* — Michael V Datskovskiy
(74) *Attorney, Agent, or Firm* — Gerald E. Hespos; Michael J. Porco

(57) ABSTRACT

According to an aspect of the present disclosure, an electrical power meter, is disclosed. The electrical power meter includes a housing for containing electrical circuitry therein, the housing including at least one of voltage and current inputs, the housing including passages extending entirely therethrough, wherein the passages are configured to receive a CT lead therethrough, and wherein the CT leads are not electrically connected to the electrical circuitry therein; and a face plate operatively supported on a surface of the housing, wherein the face plate includes at least one of displays, indicators and buttons. It is envisioned that the through passages are located along a side of the housing.

57 Claims, 16 Drawing Sheets

U.S. PATENT DOCUMENTS

| | | |
|---|---|---|
| 4,377,837 A | 3/1983 | Matsko et al. |
| 4,415,896 A | 11/1983 | Allgood |
| 4,484,021 A | 11/1984 | Schaefer et al. |
| 4,709,339 A | 11/1987 | Fernandes |
| 4,804,957 A | 2/1989 | Selph et al. |
| 4,900,275 A | 2/1990 | Fasano |
| 4,957,876 A | 9/1990 | Shibata et al. |
| 4,979,122 A | 12/1990 | Davis et al. |
| 4,989,155 A | 1/1991 | Begin et al. |
| 5,001,420 A | 3/1991 | Germer et al. |
| 5,006,790 A | 4/1991 | Beverly, II et al. |
| 5,017,860 A | 5/1991 | Germer et al. |
| 5,056,214 A | 10/1991 | Holt |
| 5,132,610 A | 7/1992 | Ying-Chang |
| 5,170,115 A * | 12/1992 | Kashiwabara et al. ........ 324/142 |
| 5,192,227 A | 3/1993 | Bales |
| 5,214,373 A * | 5/1993 | Nara et al. ................... 324/107 |
| 5,224,054 A | 6/1993 | Wallis |
| 5,245,275 A | 9/1993 | Germer et al. |
| 5,248,967 A | 9/1993 | Daneshfar |
| 5,301,122 A | 4/1994 | Halpern |
| 5,418,752 A | 5/1995 | Harari et al. |
| 5,418,837 A | 5/1995 | Johansson et al. |
| 5,450,007 A | 9/1995 | Payne et al. |
| 5,485,393 A * | 1/1996 | Bradford ..................... 702/60 |
| 5,537,340 A | 7/1996 | Gawlik |
| 5,544,312 A | 8/1996 | Hasbun et al. |
| 5,548,527 A | 8/1996 | Hemminger et al. |
| 5,555,508 A | 9/1996 | Munday et al. |
| 5,561,376 A | 10/1996 | Moore et al. |
| 5,563,506 A * | 10/1996 | Fielden et al. ................ 324/142 |
| 5,570,292 A | 10/1996 | Abraham et al. |
| 5,602,363 A | 2/1997 | Von Arx |
| 5,606,510 A | 2/1997 | Glaser et al. |
| 5,627,759 A | 5/1997 | Bearden et al. |
| 5,631,569 A | 5/1997 | Moore et al. |
| 5,650,936 A | 7/1997 | Loucks et al. |
| 5,654,081 A | 8/1997 | Todd |
| 5,675,748 A | 10/1997 | Ross |
| 5,680,640 A | 10/1997 | Ofek et al. |
| 5,704,805 A | 1/1998 | Douty et al. |
| 5,710,887 A | 1/1998 | Chelliah et al. |
| 5,715,314 A | 2/1998 | Payne et al. |
| 5,736,847 A | 4/1998 | Van Doorn et al. |
| 5,737,730 A * | 4/1998 | Alvarenga et al. ............ 705/412 |
| 5,767,790 A | 6/1998 | Jovellana |
| 5,768,632 A | 6/1998 | Husted et al. |
| 5,811,965 A | 9/1998 | Gu |
| 5,828,576 A * | 10/1998 | Loucks et al. ................ 702/65 |
| 5,862,391 A | 1/1999 | Salas |
| 5,880,927 A | 3/1999 | Kent et al. |
| 5,896,393 A | 4/1999 | Yard et al. |
| 5,896,547 A | 4/1999 | Lee |
| 5,897,607 A | 4/1999 | Jenney et al. |
| 5,907,238 A | 5/1999 | Owerko et al. |
| 5,907,476 A | 5/1999 | Davidsz |
| 5,909,492 A | 6/1999 | Payne et al. |
| 5,933,004 A | 8/1999 | Jackson et al. |
| 5,936,971 A | 8/1999 | Harari et al. |
| 5,960,204 A | 9/1999 | Yinger et al. |
| 5,963,734 A | 10/1999 | Ackerman et al. |
| 5,963,743 A | 10/1999 | Amberg et al. |
| 5,978,590 A | 11/1999 | Imai et al. |
| 5,991,543 A | 11/1999 | Amberg et al. |
| 5,994,892 A * | 11/1999 | Turino et al. ................. 324/142 |
| 5,995,911 A * | 11/1999 | Hart ............................. 702/64 |
| 6,000,034 A | 12/1999 | Lightbody et al. |
| 6,008,711 A | 12/1999 | Bolam |
| 6,009,406 A | 12/1999 | Nick |
| 6,018,700 A * | 1/2000 | Edel ............................ 702/60 |
| 6,023,160 A | 2/2000 | Coburn |
| 6,049,551 A | 4/2000 | Hinderks et al. |
| 6,059,129 A | 5/2000 | Bechaz et al. |
| 6,064,192 A * | 5/2000 | Redmyer ..................... 324/127 |
| 6,078,870 A | 6/2000 | Windsheimer |
| 6,088,659 A | 7/2000 | Kelly et al. |
| 6,091,237 A | 7/2000 | Chen |
| 6,092,189 A | 7/2000 | Fisher et al. |
| 6,133,720 A | 10/2000 | Elmore |
| 6,144,960 A | 11/2000 | Okada et al. |
| 6,163,243 A | 12/2000 | Titus |
| 6,167,383 A | 12/2000 | Henson |
| 6,182,170 B1 | 1/2001 | Lee et al. |
| 6,182,275 B1 | 1/2001 | Beelitz et al. |
| 6,185,508 B1 * | 2/2001 | Van Doorn et al. ............ 702/60 |
| 6,192,470 B1 | 2/2001 | Kelley et al. |
| 6,199,068 B1 | 3/2001 | Carpenter |
| 6,212,278 B1 | 4/2001 | Bacon et al. |
| 6,219,656 B1 | 4/2001 | Cain et al. |
| 6,246,994 B1 | 6/2001 | Wolven et al. |
| 6,247,128 B1 | 6/2001 | Fisher et al. |
| 6,262,672 B1 | 7/2001 | Brooksby et al. |
| 6,269,316 B1 | 7/2001 | Hubbard et al. |
| 6,275,168 B1 | 8/2001 | Slater et al. |
| 6,292,717 B1 * | 9/2001 | Alexander et al. ............ 700/293 |
| 6,301,527 B1 | 10/2001 | Butland et al. |
| 6,327,706 B1 | 12/2001 | Amberg et al. |
| 6,329,810 B1 * | 12/2001 | Reid ........................ 324/117 H |
| 6,363,057 B1 | 3/2002 | Ardalan et al. |
| 6,367,023 B2 * | 4/2002 | Kling et al. ................... 713/340 |
| 6,373,238 B2 | 4/2002 | Lewis et al. |
| 6,374,084 B1 | 4/2002 | Fok |
| 6,392,810 B1 * | 5/2002 | Tanaka ......................... 359/622 |
| 6,397,155 B1 * | 5/2002 | Przydatek et al. .............. 702/61 |
| 6,401,054 B1 | 6/2002 | Andersen |
| 6,429,637 B1 | 8/2002 | Gandhi |
| 6,429,785 B1 | 8/2002 | Griffin et al. |
| 6,459,175 B1 | 10/2002 | Potega |
| 6,459,997 B1 | 10/2002 | Andersen |
| 6,470,283 B1 * | 10/2002 | Edel .............................. 702/64 |
| 6,483,291 B1 | 11/2002 | Bhateja et al. |
| 6,486,652 B1 * | 11/2002 | Ouellette et al. .............. 324/142 |
| 6,493,644 B1 * | 12/2002 | Jonker et al. ................... 702/61 |
| 6,496,342 B1 | 12/2002 | Horvath et al. |
| 6,560,221 B1 | 5/2003 | Hara et al. |
| 6,618,709 B1 * | 9/2003 | Sneeringer .................... 705/412 |
| 6,636,030 B1 * | 10/2003 | Rose et al. ................... 324/142 |
| 6,657,424 B1 * | 12/2003 | Voisine et al. ............. 324/76.11 |
| 6,671,635 B1 * | 12/2003 | Forth et al. .................... 702/61 |
| 6,675,071 B1 * | 1/2004 | Griffin et al. .................. 700/286 |
| 6,687,627 B1 * | 2/2004 | Gunn et al. ..................... 702/61 |
| 6,694,270 B2 | 2/2004 | Hart |
| 6,735,535 B1 | 5/2004 | Kagan et al. |
| 6,751,563 B2 * | 6/2004 | Spanier et al. .................. 702/61 |
| 6,792,337 B2 * | 9/2004 | Blackett et al. ............... 700/295 |
| 6,792,364 B2 * | 9/2004 | Jonker et al. ................... 702/61 |
| 6,798,190 B2 * | 9/2004 | Harding et al. ............... 324/142 |
| 6,798,191 B1 | 9/2004 | Macfarlane et al. |
| 6,838,867 B2 | 1/2005 | Loy |
| 6,891,725 B2 | 5/2005 | Derksen |
| 6,957,158 B1 | 10/2005 | Hancock et al. |
| 6,988,043 B1 * | 1/2006 | Randall .......................... 702/61 |
| 6,989,667 B2 | 1/2006 | Loy |
| 7,010,438 B2 * | 3/2006 | Hancock et al. ................ 702/60 |
| 7,049,932 B2 * | 5/2006 | French et al. .................. 340/7.1 |
| 7,072,779 B2 * | 7/2006 | Hancock et al. ................ 702/60 |
| 7,085,824 B2 * | 8/2006 | Forth et al. ................... 709/221 |
| 7,089,089 B2 | 8/2006 | Cumming et al. |
| 7,116,538 B2 | 10/2006 | Haensgen et al. |
| 7,157,899 B2 * | 1/2007 | Bruno .......................... 324/142 |
| 7,158,050 B2 | 1/2007 | Lightbody et al. |
| 7,161,455 B2 | 1/2007 | Tate et al. |
| 7,167,804 B2 * | 1/2007 | Fridholm et al. ............... 702/62 |
| 7,174,261 B2 * | 2/2007 | Gunn et al. ..................... 702/62 |
| 7,265,533 B2 | 9/2007 | Lightbody et al. |
| 7,304,586 B2 * | 12/2007 | Wang et al. ............. 340/870.02 |
| 7,415,368 B2 * | 8/2008 | Gilbert et al. ................... 702/61 |
| 2001/0001866 A1 | 5/2001 | Kikinis |
| 2002/0007318 A1 | 1/2002 | Ainwick |
| 2002/0026385 A1 | 2/2002 | McCloskey et al. |
| 2002/0065741 A1 | 5/2002 | Baum |
| 2002/0091784 A1 | 7/2002 | Baker et al. |
| 2002/0104022 A1 | 8/2002 | Jorgenson |
| 2002/0120723 A1 | 8/2002 | Forth et al. |
| 2002/0152200 A1 | 10/2002 | Krichilsky |
| 2002/0156694 A1 | 10/2002 | Christensen et al. |
| 2002/0161536 A1 | 10/2002 | Suh et al. |

| | | | |
|---|---|---|---|
| 2002/0162014 | A1 | 10/2002 | Przydatek et al. |
| 2002/0169570 | A1 | 11/2002 | Spanier et al. |
| 2003/0009401 | A1 | 1/2003 | Ellis |
| 2003/0204756 | A1 | 10/2003 | Ransom |
| 2005/0134430 | A1* | 6/2005 | French et al. .................. 340/7.1 |
| 2006/0066456 | A1 | 3/2006 | Jomker et al. |
| 2006/0202858 | A1 | 9/2006 | Holle et al. |
| 2007/0136010 | A1* | 6/2007 | Gunn et al. ..................... 702/62 |

OTHER PUBLICATIONS

6200 Ion, Installation & Basic Setup Instructions, Copyright Power Measurement Ltd., Revision Date Apr. 25, 2001, 50 pages.

Ion Technology, Meter Shop User's Guide, Copyright Power Measurement Ltd., Revision Date May 10, 2001, 48 pages.

New MeterM@il and WebMeter features connect power meters over the Internet, announcement by Power Measurement Ltd., www.pwrm.com/company/news/a51, Dec. 6, 2000. p. 1 printed Jan. 30, 2004.

User's Installation & Operation and User's Programming Manual. The Futura Series, Electro Industries, pp. 1-64, Copyright 1995.

Nexus 1250 Installation and Operation Manual Revision 1.20, Electro Industries/Gauge Tech, 50 pages, Nov. 8, 2000.

Ion 770 Xpress Card, Installation & Basic Setup Guide, Power Measurement, pp. 1-15, revision date Sep. 26, 1997.

Nexus 1250, Precision Power Meter & Data Acquisition Node, Accumeasure Technology, Electro Industries/Gauge Tech, specification, 16 pages, Nov. 1999.

Multi-port Communication Card (MPCC), Multi-Port Ethernet Communications Card (MPE), Installation & Configuration Instructions, Power Measurement, pp. 1-9, revision date Jul. 25, 1997.

What's New in the 7500ION, Addendum to the User's Guide Addendum v206, Power Measurement, pp. 1-33, Dec. 20, 2000.

Ion Technology, 7500 Ion High Visibility 3-Phase Energy & Power Quality Meter, Power Measurement, specification, pp. 1-8, revision date Mar. 21, 2000.

Ion Technology, 7500 Ion 7600 Ion High Visibility Energy & Power Quality Compliance Meters, Power Measurement, specification, pp. 1-8, revision date Nov. 30, 2000.

Engage Networks, Inc., "Internet Protocol Card for Revenue Meters", http://www.engagenet.com. Link present as of Mar. 3, 2000 on http://web.archive.org/web/20010306005433/www.engagenet.com/content/products.shtml. Original document archived at http://web.archive.org/web/20030520161648/http://www.engagenet.com/dtasheet/ip-card.pdf on May 20, 2003.

Performance Power Meter & Data Acquisition Node, Electro Industries/Gauge Tech., Nexus 1250 specification, 8 pages, Dec. 14, 2000.

Futura+Series, "Advanced Power Monitoring and Analysis for the 21st Century", Electro Industries/Gauge Tech, specification, 8 pages, Apr. 13, 2000.

* cited by examiner

CURRENT INPUTS INTERFACE FOR AN ELECTRICAL DEVICE

This application is a continuation application of U.S. application Ser. No. 12/271,360, filed Nov. 14, 2008, which is a continuation application of U.S. application Ser. No. 11/894,931, filed Aug. 22, 2007, which is a continuation application of U.S. application Ser. No. 11/003,064, filed Dec. 3, 2004, entitled "Current inputs interface for an electrical device", the contents of all of which are incorporated by reference in their entirety.

BACKGROUND OF THE INVENTION

1. Technical Field

The present disclosure relates to electrical devices and/or power meters and, more particularly, to electrical devices, including electrical power meters, having current input interfaces.

2. Background of Related Art

Electric utility companies track electric usage by customers by using power meters. These meters track the amount of power consumed at a particular location. These locations range from power substations, to commercial businesses, to residential homes. The electric utility companies use the power meter to charge its customers for their power consumption, i.e. revenue metering.

A popular type of power meter is the socket-type power meter. As its name implies, the meter itself plugs into a socket for easy installation, removal and replacement. Other meter installations include panel mounted, switchboard mounted, and circuit breaker mounted. Typically the power meter connects between utility power lines supplying electricity and a usage point, namely a residence or commercial place of business. Though not typical, a power meter may also be placed at a point within the utility's power grid to monitor power flowing through that point for distribution, power loss, or capacity monitoring. Also, power meters can be used to monitor internal customer usage that handle submetering functions.

Traditionally, power meters used mechanical means to track the amount of consumed power. The inductive spinning disk power meter is still commonly used. The spinning disk drives mechanical counters that track the power consumption information.

Newer to the market are electronic power meters. Electronic meters have replaced the older mechanical meters, and utilize digital sampling of the voltage and current waveforms to generate power consumption information. In addition to monitoring power consumption, electronic meters can also monitor and calculate power quality, that is, voltage, current, real power, reactive power, and apparent power, among others. These power quality measurements and calculations are displayed on an output display device on the meter.

In more recent developments, limited power consumption information can be transmitted from the power meter to the utility through the use of telephone communications circuitry contained either within or external to the meter. These developments are advantageous to the utility company in that it reduces the need for employees being dispatched to the remote locations to collect the power consumption information. A standard modem receives raw power consumption information from the power meter and transmits the information to the utility company via telephone lines. While this represents an improvement over past techniques, this information then must be interpreted and further processed to calculate the amount of power consumption, a secondary process that results in further processing apparatus and software, and further resulting in increases to the costs and complexities of the overall system.

There is therefore a need for an electronic power meter that includes improved current inputs to facilitate new installation and/or replacement of such electronic power meters.

There is a further need for an electronic power meter that can be installed in a number of different configurations and/or a number of different wiring schemes.

SUMMARY

In accordance with the present disclosure, electrical devices and electrical power meters are provided. According to an aspect of the present disclosure, an electrical device, includes a housing for containing electrical circuitry therein, the housing including at least one of voltage and current inputs, the housing including passages extending entirely therethrough, wherein the passages are configured to receive a CT lead therethrough; and a face plate operatively supported on a surface of the housing.

The electrical device may further include at least one elongate, electrically conductive plate configured for selective positioning within the passages of the housing. Desirably, each plate includes a first end and a second end extending from the passages of the housing when the plates are positioned therein. In one embodiment, the plates may be fabricated from nickel plated brass.

Desirably, each end of the plate is configured for selective connection of a lug of a CT lead thereto. Alternately, each end of the plate is configured for selective connection of a friction fit connector of a CT lead thereto.

It is envisioned that the through passages may be located along a side of the housing. Desirably, the CT leads are not electrically connected to the electrical circuitry within the housing.

Desirably, the electrical device is configured for ANSI and DIN mounting. The electrical device is capable of connection as at least one of a three-phase, four-wire system wye with direct voltage, 3 element; a three-phase, four-wire system wye with direct voltage, 2.5 element; a three-phase, four-wire wye with PTs, 3 element; a three-phase, four-wire wye with PTs, 2.5 element; a three-phase, three-wire delta with direct voltage; and a three-phase, three-wire delta with PTs.

In one embodiment, at least one of a top surface and a bottom surface of the housing is configured to selectively receive a mounting bracket. The face plate may include at least one of displays, indicators and buttons.

According to another aspect of the present disclosure, an electrical power meter, is disclosed. The electrical power meter includes a housing for containing electrical circuitry therein, the housing including at least one of voltage and current inputs, the housing including passages extending entirely therethrough, wherein the passages are configured to receive a CT lead therethrough, and wherein the CT leads are not electrically connected to the electrical circuitry therein; and a face plate operatively supported on a surface of the housing, wherein the face plate includes at least one of displays, indicators and buttons. It is envisioned that the through passages are located along a side of the housing.

The electrical power meter further includes an elongate, electrically conductive plate configured for selective positioning within the passages of the housing. Desirably, each plate includes a first end and a second end extending from the passages of the housing when the plates are positioned therein. The plates may be fabricated from nickel plated brass.

Desirably, each end of the plate is configured for selective connection of a lug of a CT lead thereto. Alternately, each end of the plate is configured for selective connection of a friction fit connector of a CT lead thereto.

Desirably, the electrical power meter is configured for ANSI and DIN mounting. The electrical power meter is configured for connection as at least one of a three-phase, four-wire system wye with direct voltage, 3 element; a three-phase, four-wire system wye with direct voltage, 2.5 element; a three-phase, four-wire wye with PTs, 3 element; a three-phase, four-wire wye with PTs, 2.5 element; a three-phase, three-wire delta with direct voltage; and a three-phase, three-wire delta with PTs.

Desirably, at least one of a top surface and a bottom surface of the housing is configured to selectively receive a mounting bracket.

According to yet another aspect of the present disclosure, a method of installing an electrical power meter to a panel, in provided. The method includes the steps of providing an electrical power meter. The electrical power meter includes a housing for containing electrical circuitry therein, the housing including at least one of voltage and current inputs, the housing including passages extending entirely therethrough, wherein the passages are configured to receive a CT lead therethrough and wherein the CT leads are not electrically connected to the electrical circuitry therein. The housing is configured for both ANSI and DIN installations. The electrical power meter further includes a face plate operatively supported on a surface of the housing, wherein the face plate includes at least one of displays, indicators and buttons, and mounting means operatively associated with the electrical power meter for securing the electrical power meter to a panel.

The method further includes the steps of inserting a rear end of the housing into an aperture formed in a panel; at least one of passing CT leads through the passages formed in the housing and terminating CT leads to conductive plates disposed in the passages of the housing; and securing the mounting means of the electrical power meter to the panel.

Desirably, the electrical power meter includes at least one elongate, electrically conductive plate configured for selective positioning within the passages of the housing. Each plate includes a first end and a second end extending from the passages of the housing when the plates are positioned therein and configured for selective engagement with CT leads.

In one embodiment, the mounting means of the electrical meter includes threaded rods extending from the face plate and positioned for insertion into corresponding holes formed in the panel. In another embodiment, the mounting means includes brackets selectively engagable with the housing of the electrical meter.

Desirably, the electrical power meter may be configured for connection as at least one of a three-phase, four-wire system wye with direct voltage, 3 element; a three-phase, four-wire system wye with direct voltage, 2.5 element; a three-phase, four-wire wye with PTs, 3 element; a three-phase, four-wire wye with PTs, 2.5 element; a three-phase, three-wire delta with direct voltage; and a three-phase, three-wire delta with PTs.

BRIEF DESCRIPTION OF THE DRAWINGS

The advantages and features of the presently disclosed electrical device, e.g., electronic power meter, will become more readily apparent and may be understood by referring to the following detailed description or illustrative embodiments taken in conjunction with the accompanying drawings, in which.

DETAILED DESCRIPTION OF THE EMBODIMENT

Three-phase power is most commonly used in situations where large amounts of power will be used because it is a more effective way to transmit the power and because it provides a smoother delivery of power to the end load. There are two commonly used connections for three-phase power, a wye connection or a delta connection.

As used herein and as is typical in the art, a "wye connection" is understood to have a phase relation and a winding relationship between the phases which substantially approximates the look of a wye ("Y"). In a wye connection or service, the neutral (or center point of the wye) is typically grounded. This leads to common voltages of 208/120 and 480/277 (where the first number represents the phase-to-phase voltage and the second number represents the phase-to-ground voltage). The three voltages are separated by 120° electrically. Under balanced load conditions with unity power factor, the currents are also separated by 120°.

As used herein and as is typical in the art, a "delta connection" is understood to have load windings which are connected from phase-to-phase rather than from phase-to-ground.

Embodiments of the present disclosure will be described in detail herein below with reference to the accompanying drawings. In the following description, numerous specific details are set forth to provide a more thorough understanding of the present disclosure. It will be apparent, however, to one skilled in the art that the present disclosure may be practiced without these specific details. In other instances, well known functions or constructions have not been described so as not to obscure the present disclosure.

Figure 1:
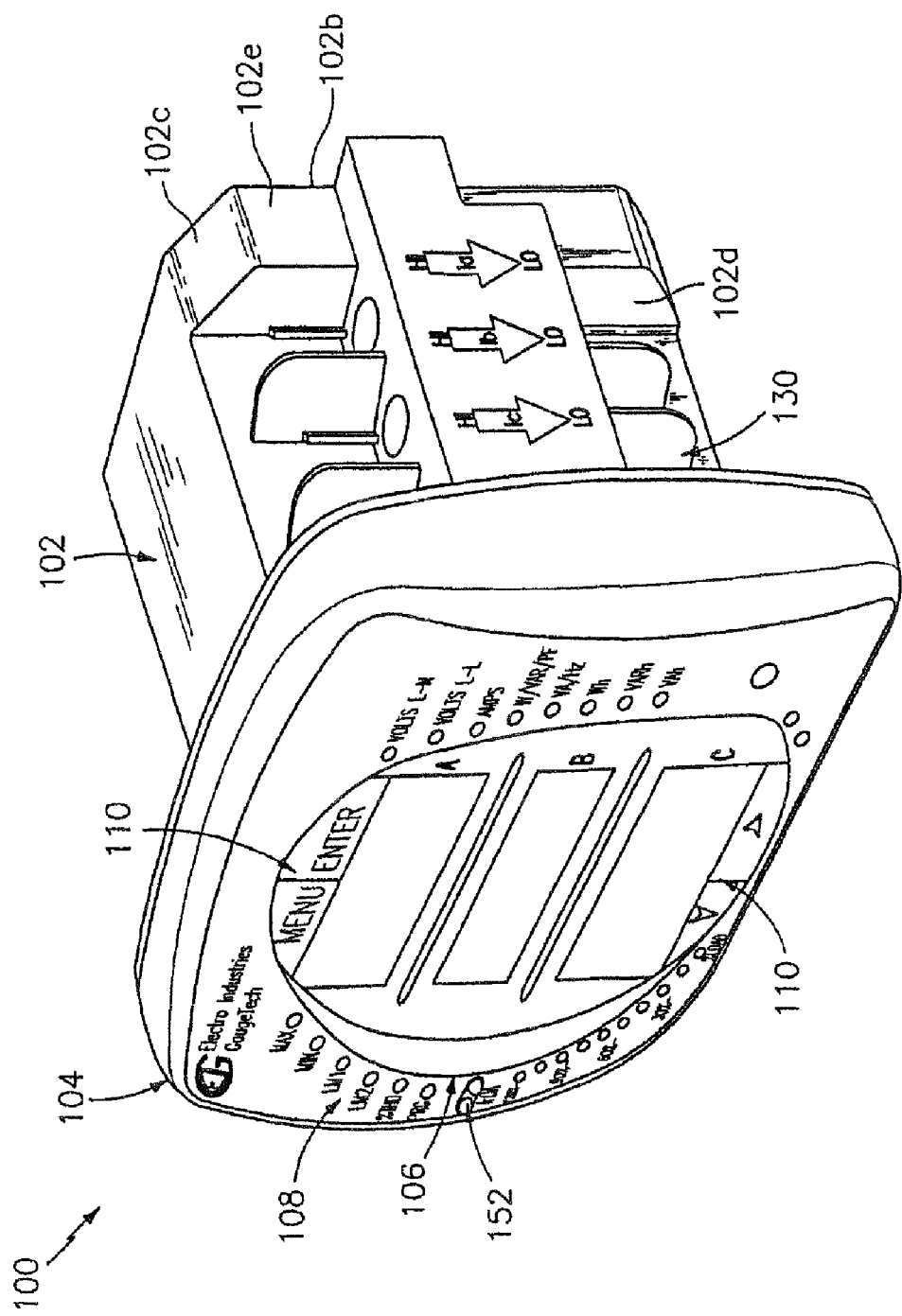
FIG. 1 is a perspective view of an electrical device in accordance with the present disclosure.
Figure 2A:
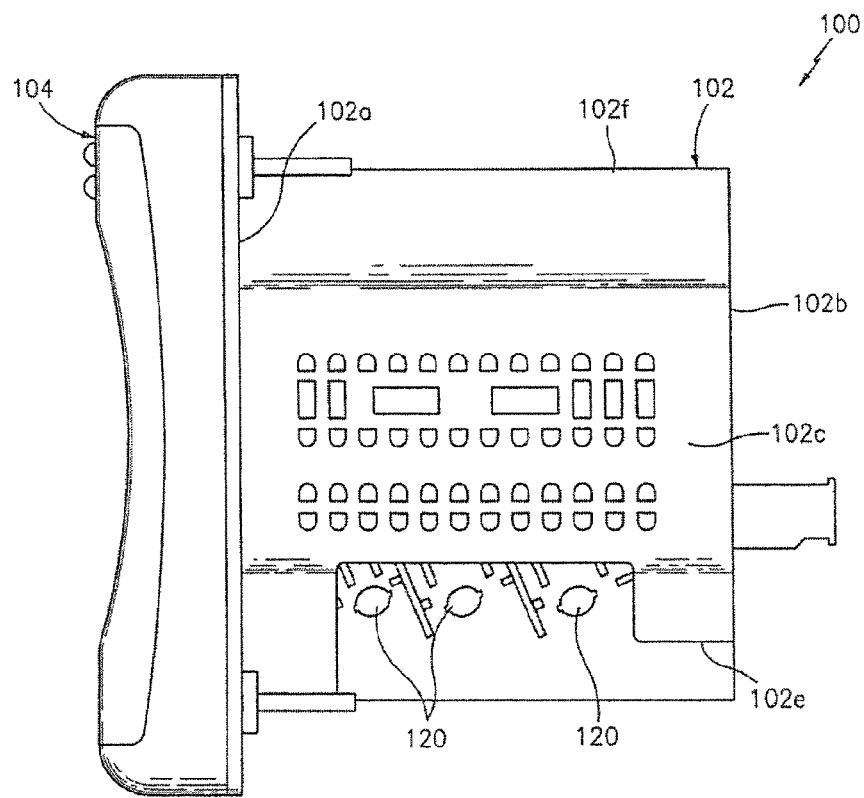
FIG. 2A is a top plan view of the electrical device of FIG. 1.
Figure 2B:
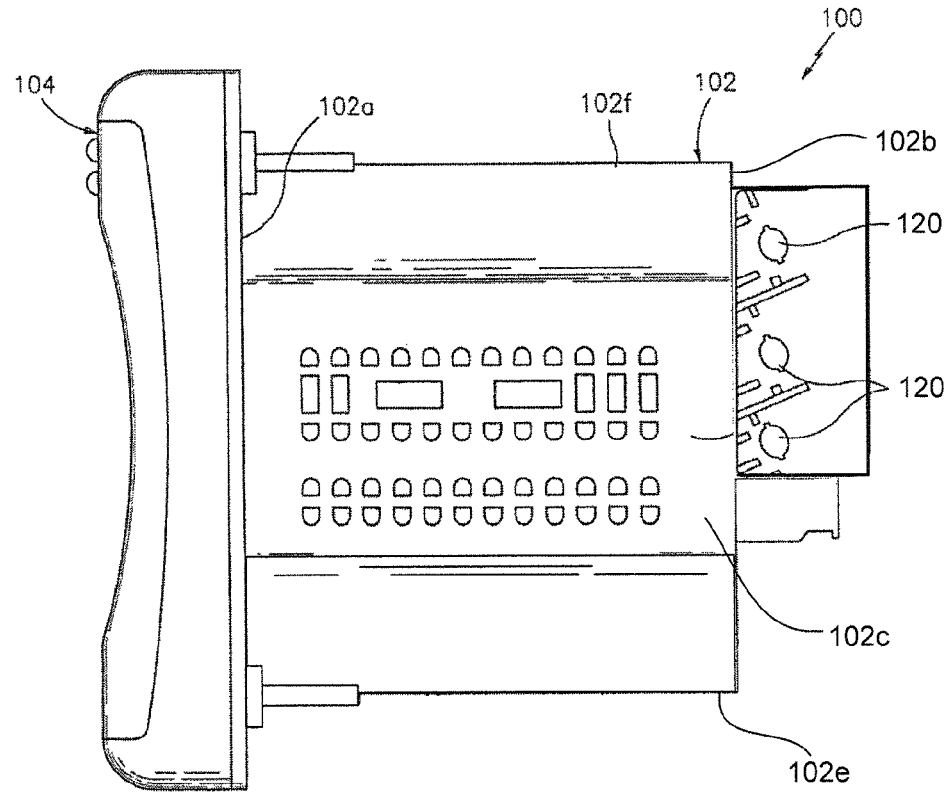
FIG. 2B is a top plan view of another embodiment of the electrical device in accordance with the present disclosure.
Figure 3:
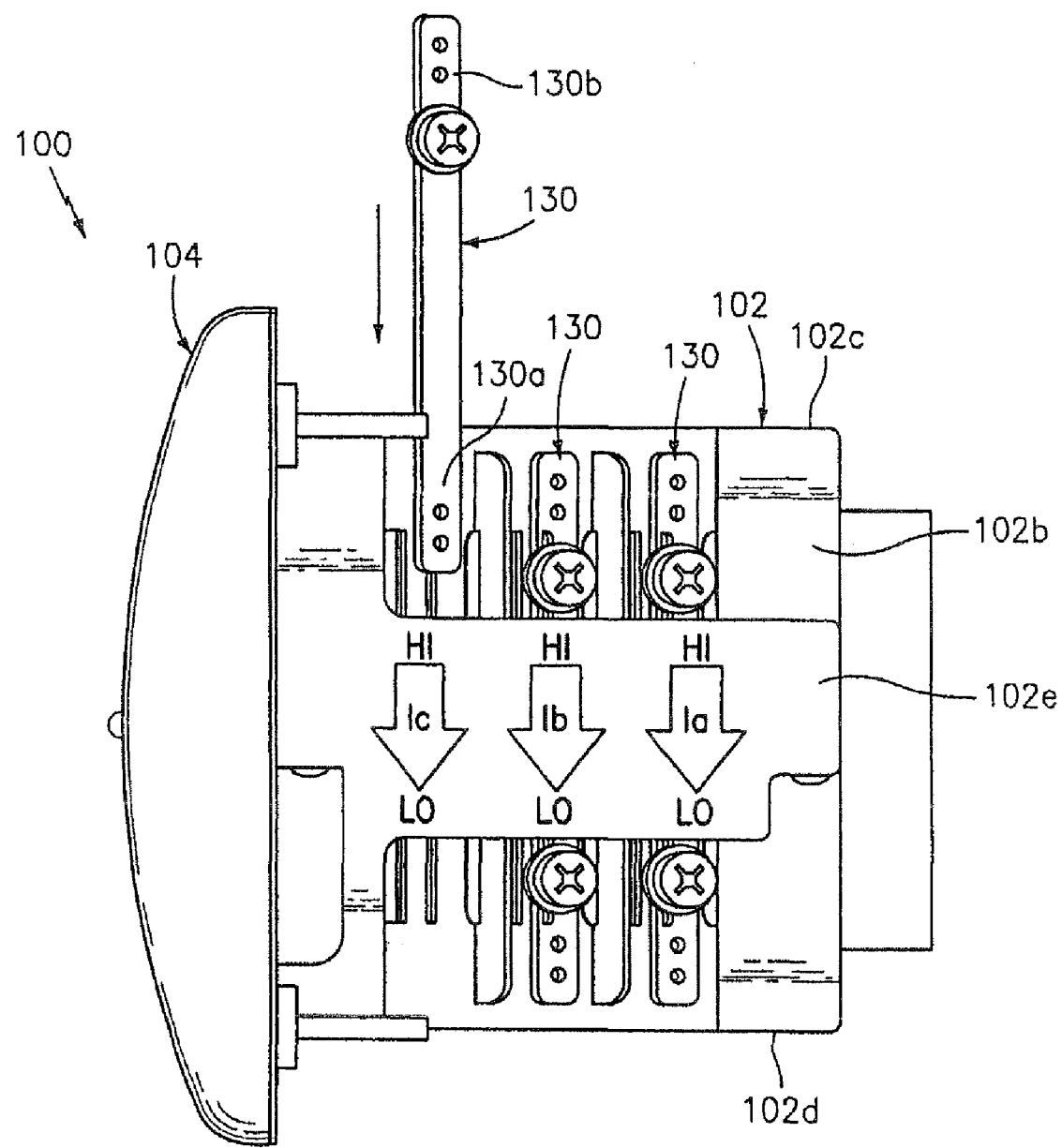
FIG. 3 is a side elevational view of the electrical device of FIGS. 1 and 2.

Referring initially to FIGS. 1-3, an electrical device, e.g., an electronic power meter, in accordance with an embodiment of the present disclosure, is generally designated as 100. As seen in FIGS. 1-3, electrical device 100 includes a housing 102 defining a front surface 102a, a rear surface 102b, a top surface 102c, a bottom surface 102d, a right side surface 102e, and a left side surface 102f. Electrical device 100 includes a face plate 104 operatively connected to front surface 102a of housing 102.

Face plate 104 includes displays 106, indicators 108 (e.g., LEDs and the like), buttons 110, and the like providing a user with an interface for visualization and operation of electrical device 100. For example, as seen in FIG. 1, face plate 104 of electrical device 100 includes analog and/or digital displays 106 capable of producing alphanumeric characters. Face plate 104 includes a plurality of indicators 108 which, when illuminated, indicate to the user the "type of reading", the "% of load bar", the "parameter designation" which indicates the reading which is being displayed on displays 106, a "scale selector" (e.g., Kilo or Mega multiplier of Displayed Readings), etc. Face plate 104 includes a plurality of buttons 110 (e.g., a "menu" button, an "enter" button, a "down" button, a "right" button, etc.) for performing a plurality of functions, including and not limited to: viewing of meter information; enter display modes; configuring parameters; performing resets; performing LED checks; changing settings; viewing parameter values; scrolling parameter values; and viewing limit states.

Figure 5:
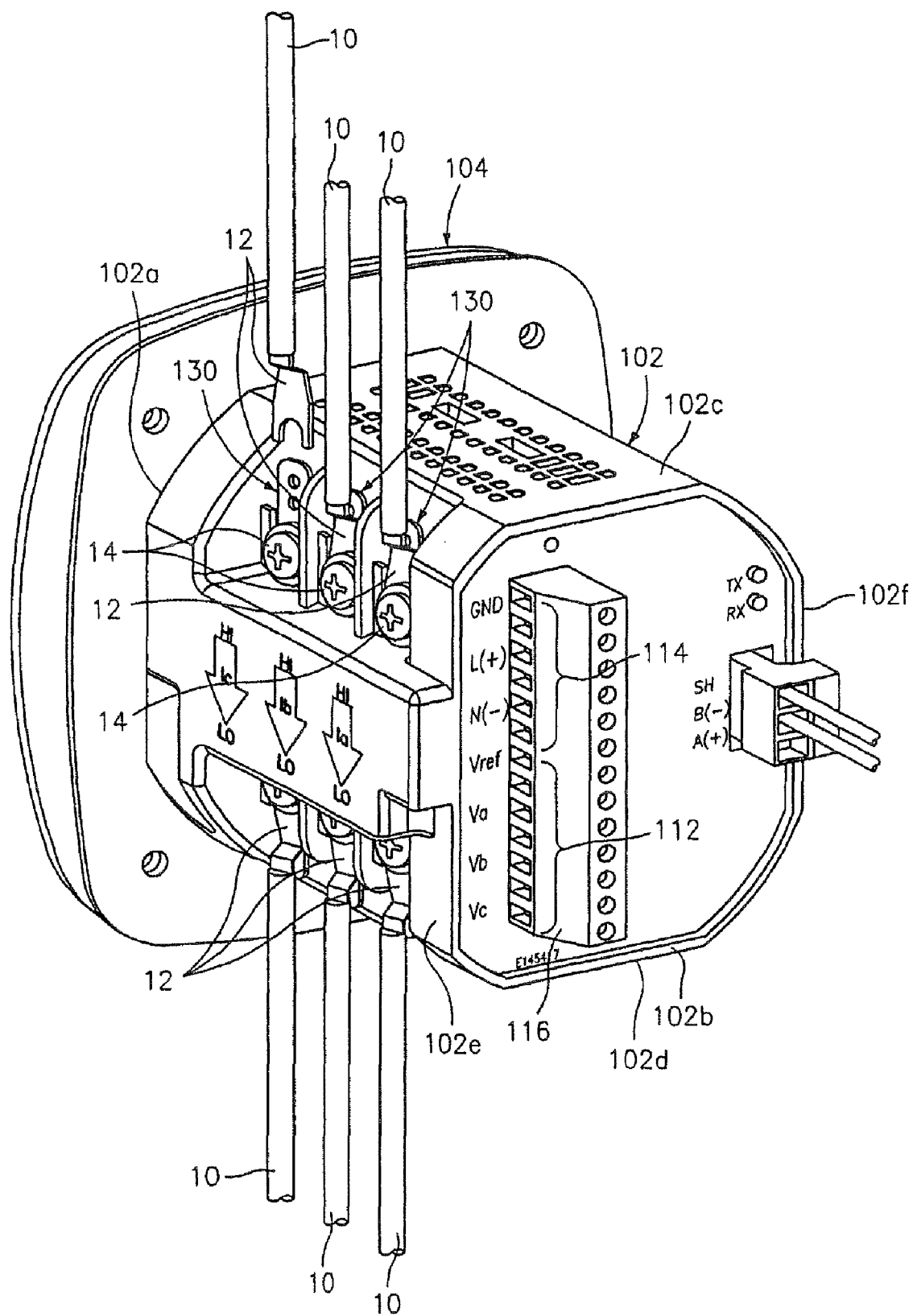
FIG. 5 is a rear perspective view of the electrical device of FIGS. 1-3 illustrating the connection of lead terminals thereto, in accordance with another method of the present disclosure.
Figure 6:
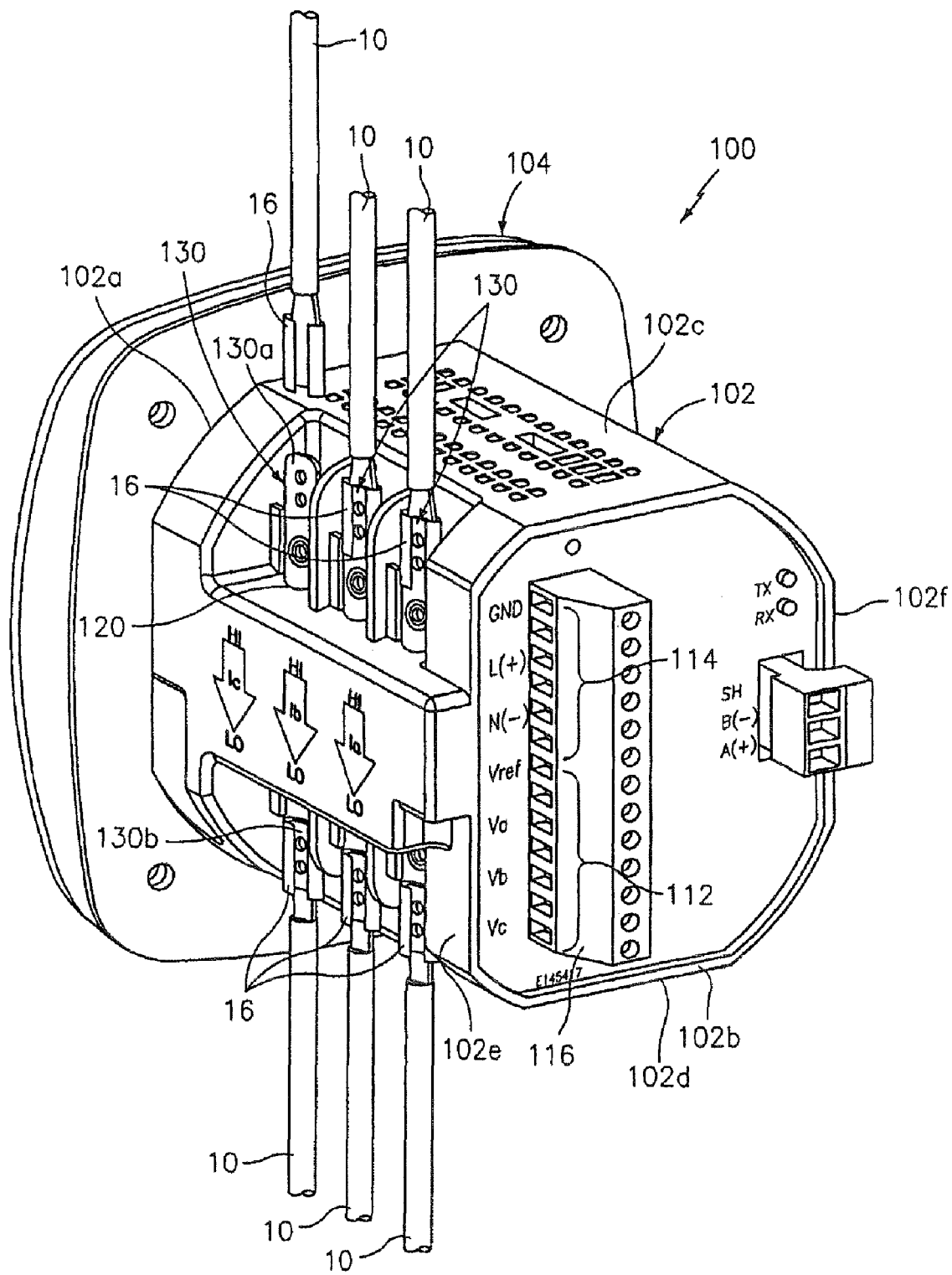
FIG. 6 is a rear perspective view of the electrical device of FIGS. 1-3 illustrating the connection of lead terminals thereto, in accordance with yet another method of the present disclosure.
Figure 7:
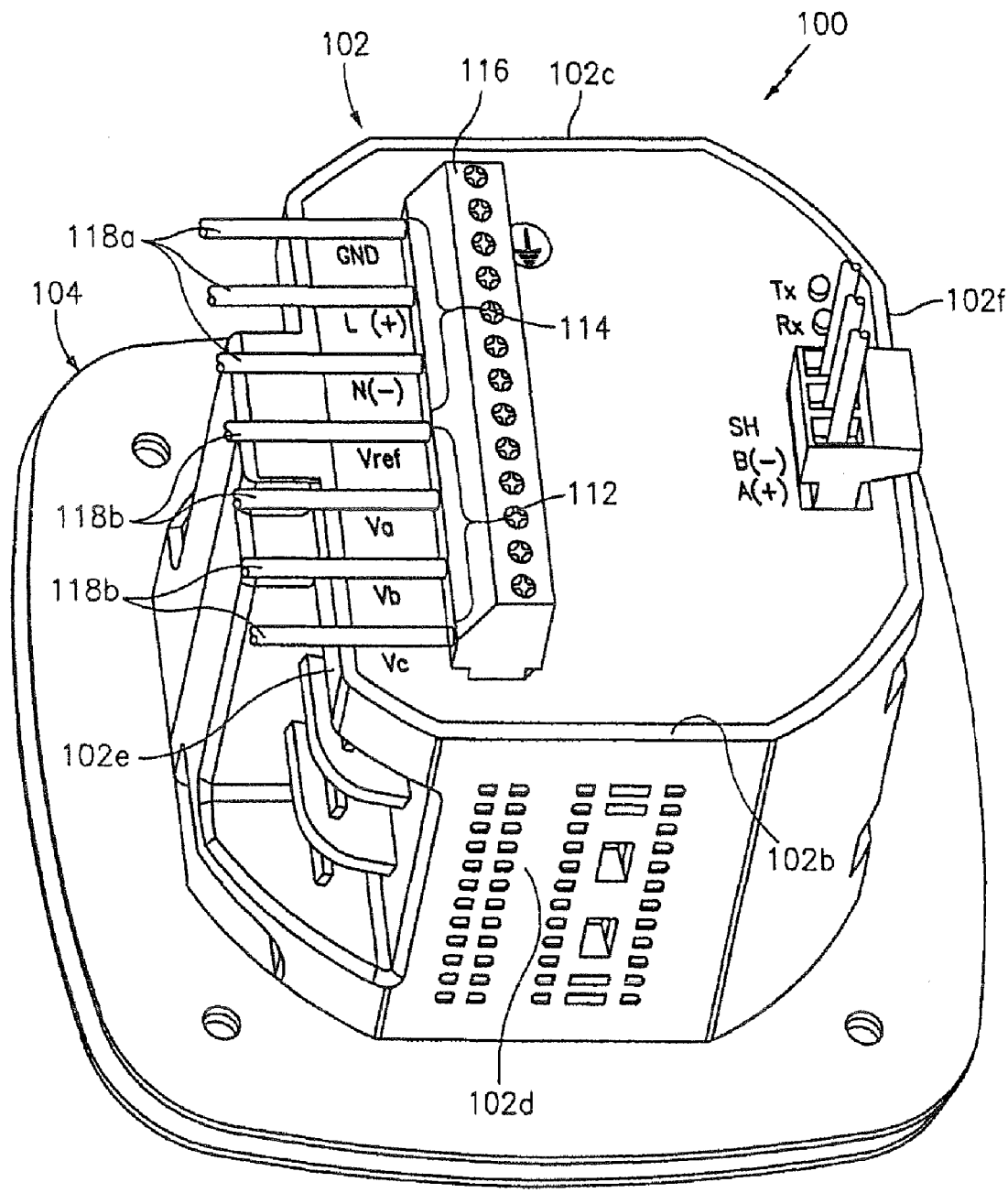
FIG. 7 is a rear perspective view of the electrical device of FIGS. 1-3 illustrating the connection of power supply and voltage inputs thereto, in accordance with a method of the present disclosure.

As seen in FIGS. 4-7, housing 102 includes voltage connections or inputs 112 provided preferably on rear surface 102b thereof, and current inputs 114 provided preferably along right side surface 102e thereof. Desirably, a connector 116 or the like may be used to connect power supply lines 118a and/or voltage supply lines 118b to voltage inputs 112. In particular, as seen in FIG. 7, power supply lines 118a and voltage supply lines 118b are electrically connected to connector 116 which is, in turn, electrically connected to voltage inputs 112. Power supply lines 118a and voltage supply lines 118b are electrically connected to internal components, circuitry and/or printed circuit boards (not shown) of electrical device 100.

As seen in FIG. 2A, housing 102 includes a series of pass-throughs or apertures 120 formed along right side surface 102e thereof and extending desirably between top surface 102c and bottom surface 102d thereof. While apertures 120 are shown and described as being formed along right side surface 102e of housing 102 it is envisioned and within the scope of the present disclosure for apertures 120 to be formed along any side of housing 102, e.g., along the rear surface 102b as shown in FIG. 2B. As will be described in greater detail below, apertures 120 enable connection of electrical device 100 according to a first method, e.g., a "CT (Current Transformer) Pass Through" method.

As seen in FIG. 3, electrical device 100 may include a plurality of "gills" 130 configured and dimensioned to extend through each aperture 120 of housing 102. Gills 130 are desirably elongate electrically conductive plates or bars having a first end 130a and a second end 130b. As will be described in greater detail below, gills 130 allow for CT leads to be terminated on electrical device 100. Desirably, gills 130 are fabricated from nickel plated brass.

Figure 4:
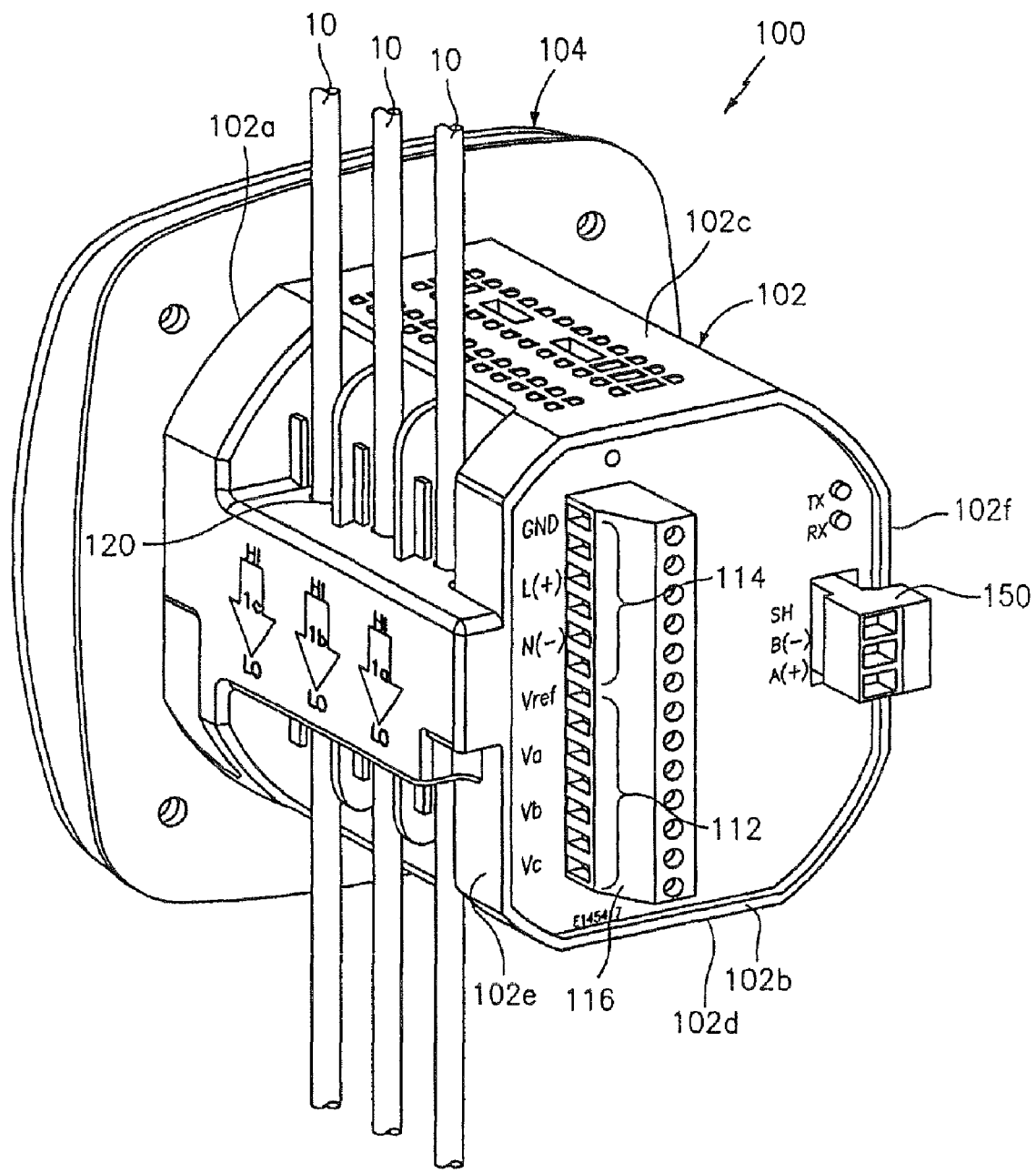
FIG. 4 is a rear perspective view of the electrical device of FIGS. 1-3 illustrating the connection of lead terminals thereto, in accordance with a method of the present disclosure.

Turning now to FIG. 4, a method of connecting electrical device 100 according to the "CT Pass Through" method is shown and described. Connection of electrical device 100 according to the "CT Pass Through" method typically requires passage of CT lead(s) 10 through apertures 120 of housing 102. Accordingly, CT lead(s) 10 pass directly though electrical device 100 without any physical termination on electrical device 100. Extending CT leads 10 to electrical device 100 according to the "CT Pass Through" method insures that electrical device 100 cannot be a point of failure on the circuit.

Turning now to FIG. 5, an alternate method of connecting electrical device 100 is shown and described. As seen in FIG. 5, gills 130 have been inserted into apertures 120 formed in housing 102. Desirably, first ends 130a of gills 130 are exposed along top surface 102c of housing 102 and second ends 130b of gills 130 are exposed along bottom surface 102d of housing 102. In this manner, CT leads 10 may be electrically connected to first ends 130a of gills 130 and/or second ends 130b of gills 130. Desirably, CT leads 10 are provided with an "O" or "U" lug 12 at a free end thereof for terminating CT leads 10 to gills 130. For example, a screw 14 or the like may be used to connect lug 12 of CT lead 10 to gill 130. As seen in FIG. 5, by terminating CT leads 10 to gills 130 of electrical device 100, the possibility of a point of failure occurring at electrical device 100 is eliminated.

As seen in FIG. 6, according to an alternate method, lugs 12 may be replaced by friction fit quick connectors 16. Accordingly, in use, CT leads 10 may be terminated and/or electrically connected to gills 130 by sliding quick connectors 16 over the tips of first and second ends 130a, 130b of gills 130.

In each of the embodiments above, CT leads 10 either extend through housing 102 of electrical device or terminate on gills 130 which are un-connected to any electrical component of electrical device 100. Unlike the embodiments disclosed herein, other electrical device (e.g., electrical meters) utilize terminal blocks to pass the current, traveling through the CT leads, through a soldered connection on a printed circuit board. Accordingly, the prior art electrical devices may be susceptible to burn-out or failure in the event of a surge in current through the CT leads.

Figure 8A:
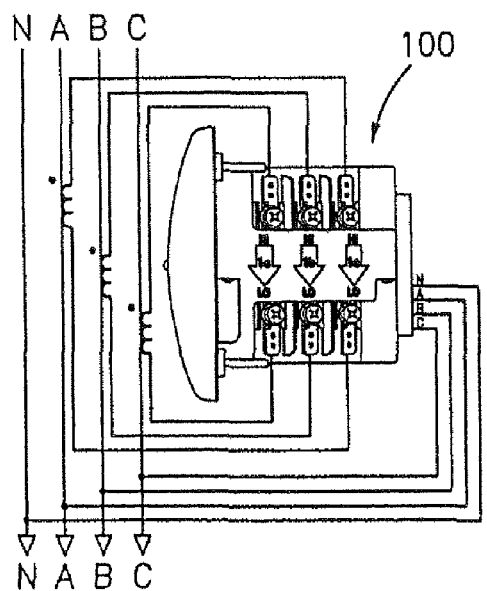
FIGS. 8A-8F illustrate several exemplary electrical connection diagrams for the electrical device of FIGS. 1-3.
Figure 8B:
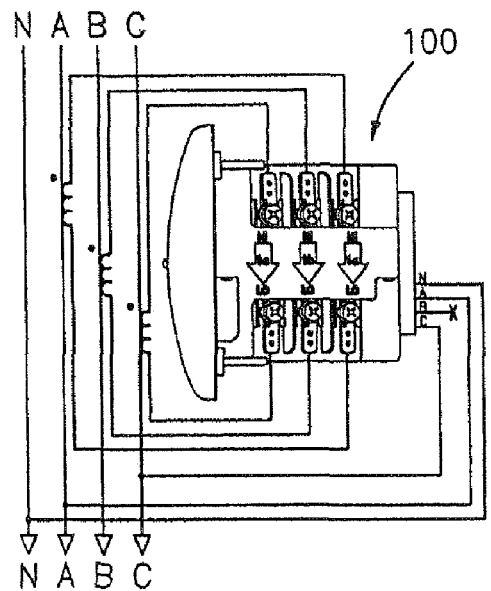
Figure 8C:
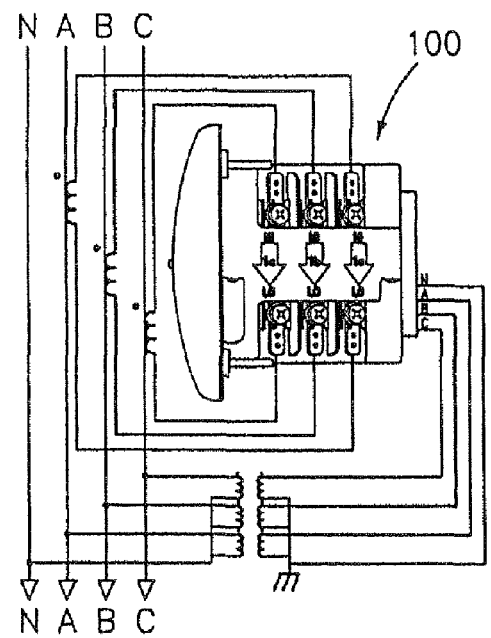
Figure 8D:
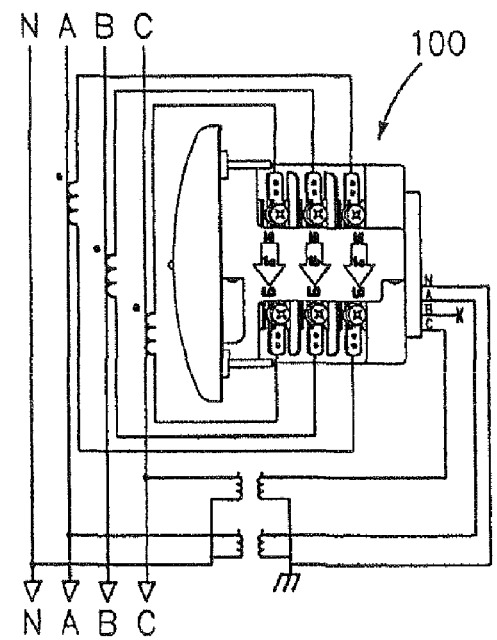
Figure 8E:
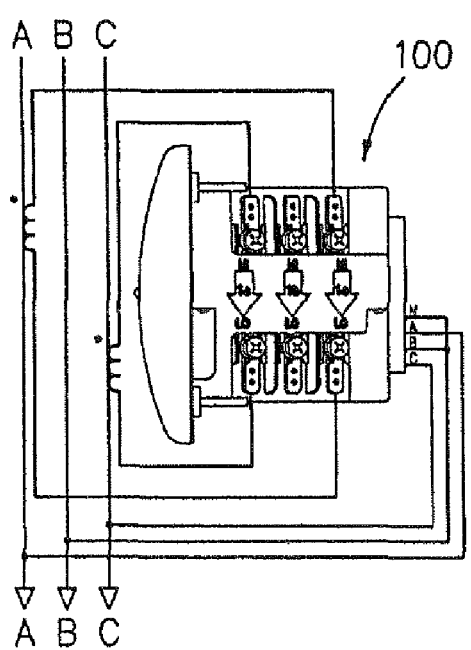
Figure 8F:
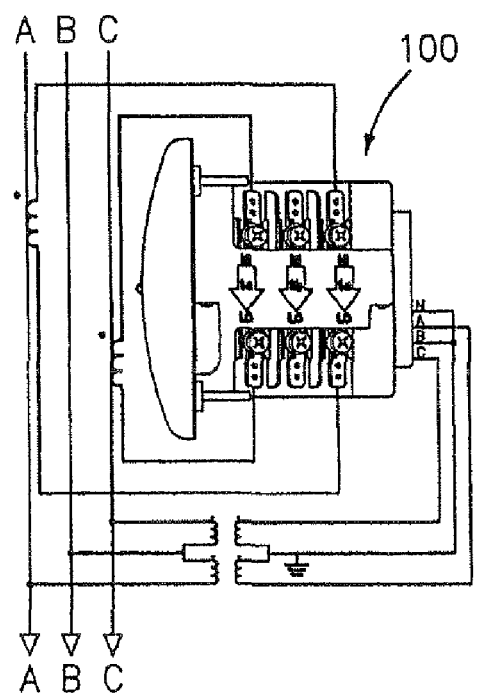

Turning now to FIGS. 8A-8F, various electrical connection diagrams for the connection of electrical device 100, are shown and described. With reference to FIG. 8A, a connection diagram for a three-phase, four-wire system wye with direct voltage, 3 element, is shown. With reference to FIG. 8B, a connection diagram for a three-phase, four-wire system wye with direct voltage, 2.5 element, is shown. With reference to FIG. 8C, a connection diagram for a three-phase, four-wire wye with PTs ("Potential Transformers"), 3 element, is shown. With reference to FIG. 8D, a connection diagram for a three-phase, four-wire wye with PTs ("Potential Transformers"), 2.5 element, is shown. With reference to FIG. 8E, a connection diagram for a three-phase, three-wire delta with direct voltage, is shown. With reference to FIG. 8F, a connection diagram for a three-phase, three-wire delta with PTs, is shown.

Electrical device 100 may include a digital sampler for sampling a voltage and a current at a sampling point, and a processor for processing at least one of the sampled voltage and the sampled current. Exemplary embodiments of a digital sample and processor are disclosed in U.S. Pat. No. 6,751,563, the entire contents of which are incorporated herein by reference.

Figure 11A:
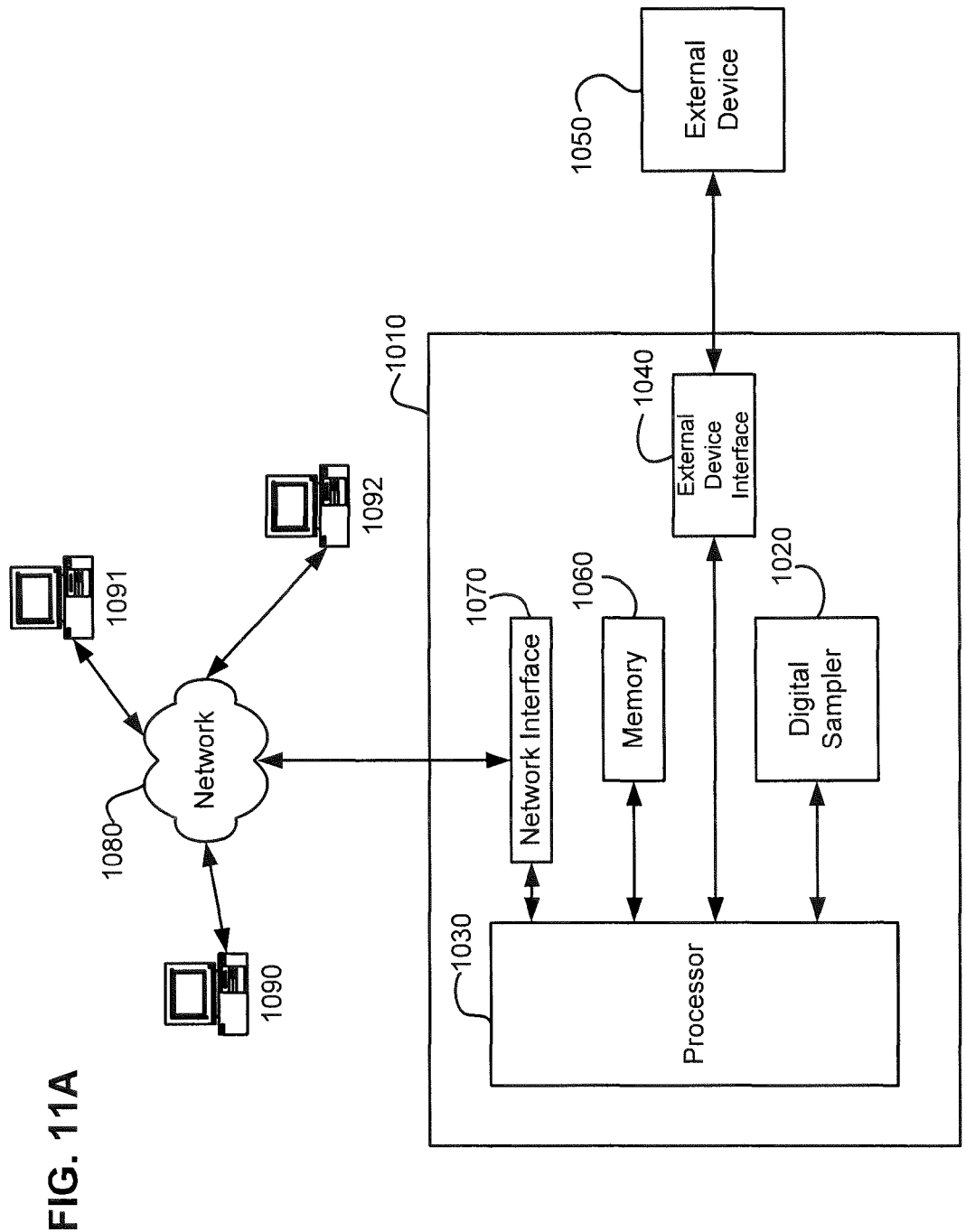
FIG. 11A is a block diagram of a power quality and revenue meter according to an embodiment of the present disclosure.

Portions of U.S. Pat. No. 6,751,563 will be reproduced here. FIG. 11A is a block diagram of a web server power quality and revenue meter according to an embodiment of the present invention. Shown in FIG. 11A are power quality and revenue meter (meter) 1010. The meter is connected to monitor electric distribution power lines (not shown), to monitor voltage and current at the point of connection. Included therein is digital sampler 1020 for digitally sampling the voltage and current of the power being supplied to a customer or monitored at the point of the series connection in the power grid. Digital sampler 1020 digitally samples the voltage and current. The digital samples are then forwarded to processor 1030 for processing. Also connected to processor 1030 is external device interface 1040 for providing an interface for external devices 1050 to connect to meter 1010. These external devices might include other power meters, sub-station control circuitry, on/off switches, etc. Processor 1030 receives data packets from digital sampler 1020 and external devices 1050, and processes the data packets according to user defined or predefined requirements. A memory 1060 is connected to processor 1030 for storing data packets and program algorithms, and to assist in processing functions of processor 1030. These processing functions include the power quality data and revenue calculations, as well as formatting data into different protocols which will be described later in detail. Processor 1030 provides processed data to network 180 through network interface 1070. Network 1080 can be the Internet, the World Wide Web (WWW), an intranet, a wide area network (WAN), or local area network (LAN), among others. In the preferred embodiment, the network interface converts the data to an Ethernet TCP/IP format. The use of the Ethernet TCP/IP format allows multiple users to access the power meter simultaneously. In a like fashion, network interface 1070 might be comprised of a modem, cable connection, or other devices that provide formatting functions. Computers 1090-1092 are shown connected to network 1080.

A web server program (web server) is contained in memory 1060, and accessed through network interface 1070. The web server provides real time data through any known web server interface format. For example, popular web server interface formats consist of HTML and XML formats. The actual format of the programming language used is not essential to the present invention, in that any web server format can be incorporated herein. The web server provides a user friendly interface for the user to interact with the meter 1010. The user can have various access levels to enter limits for e-mail alarms. Additionally, the user can be provided the data in a multiple of formats including raw data, bar graph, charts, etc. The currently used HTML or XML programming languages provide for easy programming and user friendly user interfaces.

The operation of the device of FIG. 11A will now be described. Digital sampler 1020 samples the voltage and current at and flowing through the point of connection, or sampling point. The voltage and current readings, in the form of data packets, are forwarded to processor 1030 where they undergo various power calculations. Processor 1030 calculates, for example, instantaneous voltage and current, real power, reactive power, and apparent power. The processing algorithms can be preprogrammed into memory 1060, uploaded by an end user, or performed at the end-user's location. The calculations performed by processor 1030 are not meant to be all inclusive, as the processor can be programmed to provide any number of preprogrammed or user defined calculations. In addition to performing the calculations, processor 1030 sends the packet data to memory 1060 to be stored for future access. As digital sampler 1020 is sampling the voltage and current at the sampling point, external device 150 can be feeding parallel information to processor 1030 through external device interface 1040. This external device packet data would be processed and stored in a similar manner as the digital sampler packet data. Processor 1030 then formats the processed data into various network protocols and formats. The protocols and formats can, for example, consist of the web server HTML or XML formats, Modbus TCP, RS-485, FTP or e-mail. Dynamic Host Configuration Protocol (DHCP) can also be used to assign IP addresses. The network formatted data is now available to users at computers 1090-1092 through network 1080, that connects to meter 1010 at the network interface 1070.

In one embodiment of the present disclosure, network interface 1070 is an Ethernet interface that supports, for example, 100 base-T or 10 base-T communications. This type of network interface can send and receive data packets between WAN connections and/or LAN connections and the meter 1010. This type of network interface allows for situations, for example, where the web server may be accessed by one user while another user is communicating via the Modbus TCP, and a third user may be downloading a stored data file via FTP. The ability to provide access to the meter by multiple users, simultaneously, is a great advantage over the prior art. This can allow for a utility company's customer service personnel, a customer and maintenance personnel to simultaneously and interactively monitor and diagnose possible problems with the power service.

Figure 11B:
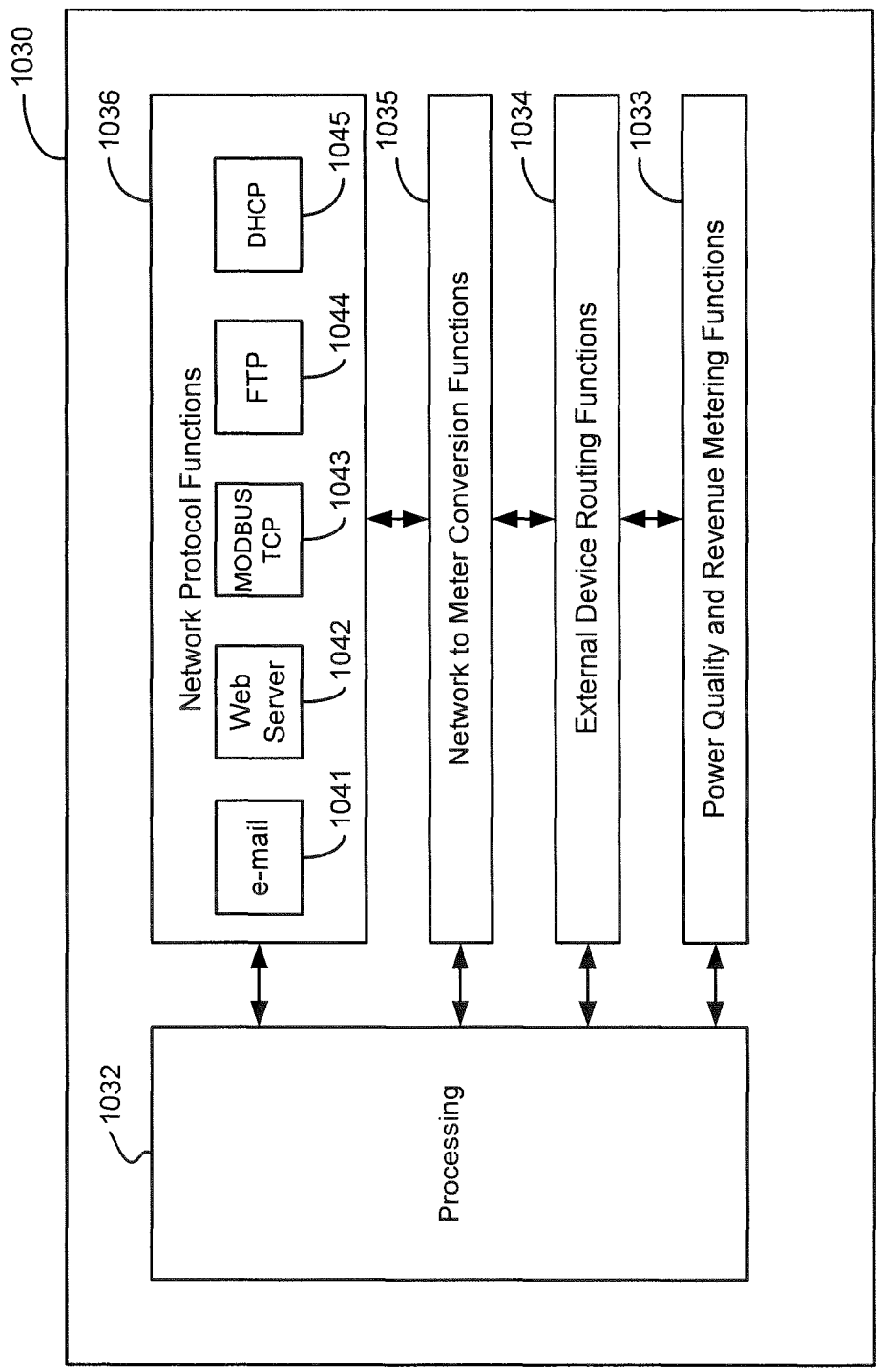
FIG. 11B is a functional block diagram of the processor functions of a power quality and revenue meter system shown in FIG. 11A according to an embodiment of the present disclosure.
Figure 12A:
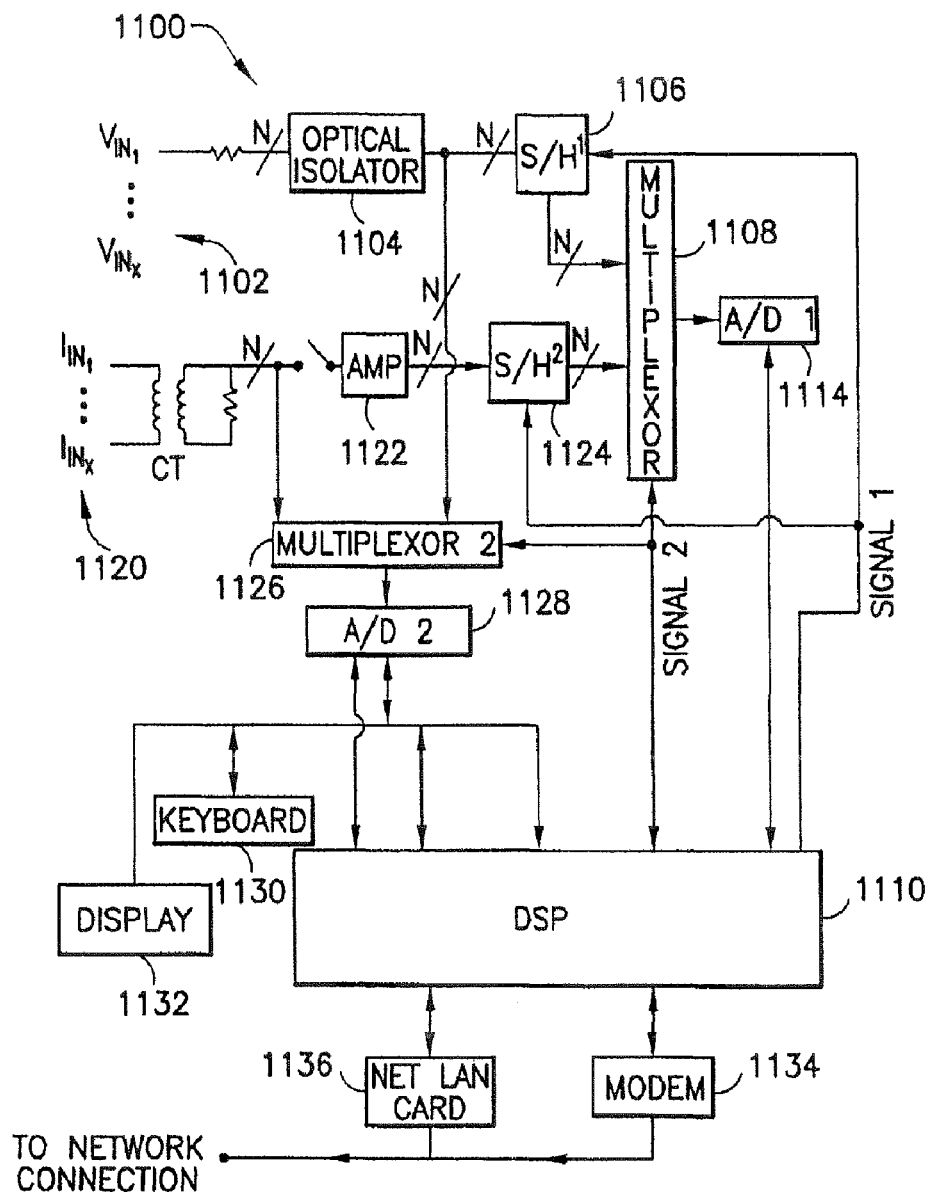
FIG. 12A is a diagram of a power meter according to the present disclosure.
Figure 12B:
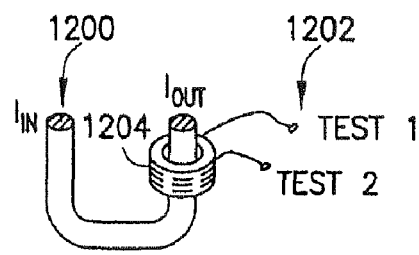
FIG. 12B illustrates a coupling device of the power meter of FIG. 11 for coupling the power meter to an electrical power line to protect the power meter from excessive current.

FIG. 11B is a functional block diagram of processor 1030 of the web server power quality and revenue meter system according to the embodiment of the present invention. FIG. 11B illustrates the functional processing structure of processor 1030. Processor 1030 is shown containing four main processing functions. Processing 1032 can be realized in various memory configurations, and are not limited to any one configuration. The functions shown are illustrative and not meant to be inclusive of all possible functions performed by processor 1032. Power Quality and Revenue Metering functions (metering functions) 1033 consists of a complete set of functions which are needed for power quality and revenue metering. Packet data collected by digital sampler 1020 is transmitted to processor 1030. Processor 1030 calculates, for example, power reactive power, apparent power, and power factor. The metering function 1033 responds to commands via the network or other interfaces supported by the meter. External Device Routing Functions 1034 handle the interfacing between the external device 1050 and meter 1010. Raw data from external device 1050 is fed into meter 1010. The external device 1050 is assigned a particular address. If more than one external device is connected to meter 1010, each device will be assigned a unique particular address.

Referring again to FIG. 11A, network interface 1070 can support, for example, either 100 base-T or 10 base-T communications, and receives and sends data packet between a wide area network (WAN) connection and/or local area network (LAN) connection and the meter. The Network Protocol Functions of meter 1010 are executed by processor 1030 which executes multiple networking tasks that are running concurrently. As shown in FIG. 11B, these include, but are not limited to, the following network tasks included in network protocol functions 1036: e-mail 1041, web server 1042, Modbus TCP 1043, FTP 1044, and DHCP 1045. The e-mail 1041 network protocol function can be utilized to send e-mail messages via the network 1080 to a user to, for example, notify the user of an emergency situation or if the power consumption reaches a user-set or pre-set high level threshold.

As the processor receives packets of data it identifies the network processing necessary for the packet by the port number associated with the packet. The processor allocates the packet to a task as a function of the port number. Since each task is running independently the meter 1010 can accept different types of requests concurrently and process them transparently from each other. For example, the web server may be accessed by one user while another user is communicating via Modbus TCP and at the same time a third user may download a log file via FTP.

The Network to Meter Protocol Conversion Function 1035 is used to format and protocol convert the different network protocol messages to a common format understood by the other functional sections of meter 1010. After the basic network processing of the packet of data, any "commands" or data which are to be passed to other functional sections of meter 1010 are formatted and protocol converted to a common format for processing by the Network to Meter Protocol Conversion Function 1035. Similarly, commands or data coming from the meter for transfer over the network are pre-processed by this function into the proper format before being sent to the appropriate network task for transmission over the network. In addition this function first protocol converts and then routes data and commands between the meter and external devices.

Electrical device 100 may include an auto-calibration feature and a data acquisition node for measuring the power usage and power quality of electrical power in an electrical power distribution network. Exemplary embodiments of an auto-calibration feature and a data acquisition node are disclosed in U.S. Pat. No. 6,735,535, the entire contents of which are incorporated herein by reference.

Portions of U.S. Pat. No. 6,735,535 will be reproduced here. Referring to FIG. 11A, there is shown an exemplary diagram of a power meter for calibrating voltage and current inputs according to the principles of the present invention. The power meter is designated generally by reference numeral 1100 and includes a plurality of voltage input lines 1102, Vin, for receiving N voltage inputs which are optically isolated by a respective optical isolator 1104, as known in the art, to protect the power meter 1100. The N voltage inputs are received from the respective optical isolators 1104 by a respective sample and hold circuitry 1106 (S/H 1). Based on a control signal, the N voltage outputs of the respective sample and hold circuitry 1106 are transmitted to a first multiplexor 108. The first multiplexor 1108 receives a control signal (SIGNAL 2) from a DSP 1110 to output at least one of the N voltage outputs received from the respective sample and hold circuitry 1106. The voltage output from the first multiplexor 1108 is received by a first analog-to-digital converter 1114 which converts the analog voltage output signal to a digital voltage signal. The digital voltage signal is subsequently transmitted to the DSP 1110.

The power meter 1100 also includes a plurality of current input lines 1120, Iin, which receive N current inputs which are sampled through respective current transformers CT. The N current inputs are transmitted to a respective amplifier 1122 and then to respective sample and hold circuitry 1124 (S/H 2). Based on control signal (SIGNAL 1), the sample and hold circuitry 1124 transmits the N current inputs to the first multiplexor 1108. Subsequently, based on control signal (SIGNAL 2), the first multiplexor 1108 outputs a current output to the first analog-to-digital converter 1114, which is subsequently transmitted to the DSP 1110.

The N voltage inputs and N current inputs are also received by a second multiplexor 1126 and at least one voltage input and at least one current input are transmitted to a second analog-to-digital converter 1128 based on the control signal (SIGNAL 2). The outputs from the second analog-to-digital converter 1128 are transmitted to the DSP 1110. The DSP 1110 is connected to peripherals, such as a keyboard 1130, a display 1132, a modem 1134, and a network card interface 1136 for communicating with the power meter 1100 from a remote station (not shown), preferably through a network connection.

The digital representation of each of the N voltage and N current inputs is processed and stored within the DSP 1110. The DSP 1110 includes at least a random access memory (RAM) and a read only memory (ROM).

Referring to FIG. 11B, there is shown a coupling device for sampling the N current inputs while protecting the power meter 1100 from excessive current. The input and output currents Iin, Iout are connected via a U-shaped metal rod 1200, which is preferably ¼ inch thick, that bears current for the input current signal Iin. The current of the input current signal In is measured via a toroid sensor 1202 attached to a toroid 1204. The toroid 1204 is implemented to preferably convert the input current to a proportional voltage. The U-shaped metal rod 1200 traverses through the toroid 1204 for the input current signal Iin, as noted above. The metal rod 1200 also acts as a primary winding having a single turn and the toroid 1204 acts as the secondary winding. The toroid 1204 preferably contains approximately 1000 turns.

Electrical device 100 may be a revenue grade meter having high speed transient detection, such as the meter disclosed in U.S. Pat. No. 6,636,030, the entire contents of which are incorporated herein by reference.

Figure 13A:
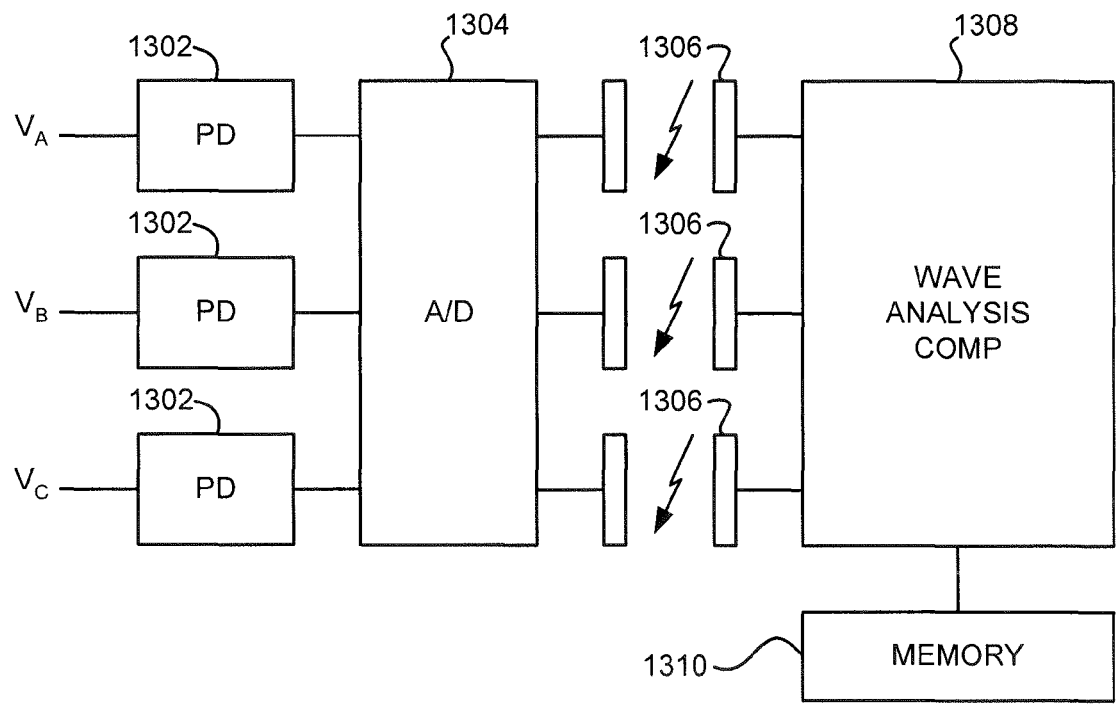
FIG. 13A is block diagram illustrating a revenue grade meter having high speed transient detection in accordance with an embodiment of the present disclosure.

Portions of U.S. Pat. No. 6,636,030 will be reproduced here. A revenue grade power meter capable of detecting high-speed power quality events, such as transients and spikes, is illustrated in FIG. 13A. Aside from comprising the components conventionally provided in a revenue grade power meter, enabling the conventional meter to monitor various power metering parameters such as voltage, current, frequency, W, VAR, VA, PF, etc. (not shown or described as they are known in the art and would create unnecessary detail), this embodiment comprises at least one high-pass filter (not shown), high-speed peak detectors 1302, which may be either analog peak detectors or very fast sampling digital peak detectors for detecting peaks in the metered power, Analog/Digital Converters 1304 for converting detections from the analog peak detectors to a digital signal (not necessary if using very fast sampling digital peak detectors), electrical isolators 1306 (for example, opto-electrical isolators may be used), a Wave Analysis Component (WAC) 1308 for analyzing any high-speed power quality event, and a memory 1310 for storing the metered power, including any high-speed power quality events.

Figure 13B:
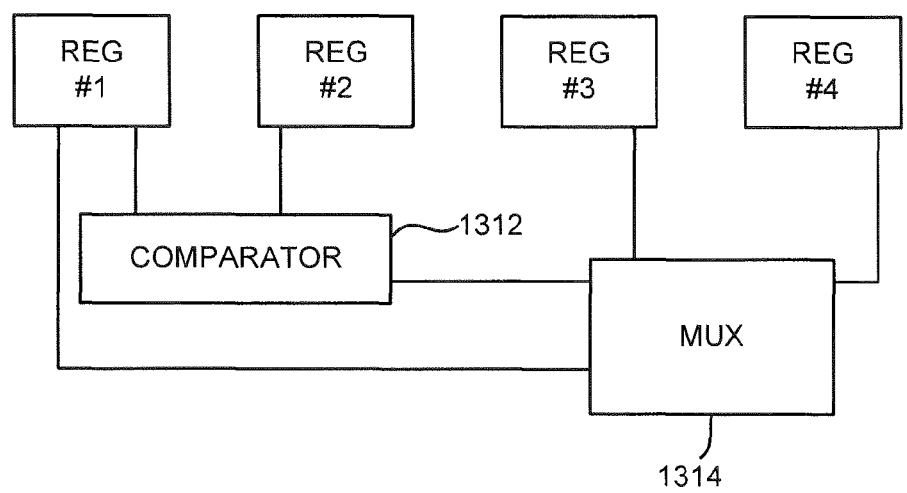
FIG. 13B is a block diagram illustrating the structure of the wave analysis component of the meter shown in FIG. 13A.

FIG. 13B is a block diagram illustrating the structure of the Wave Analysis Component (WAC) 1308 of the preferred embodiment illustrated in FIG. 13A. For illustrative purposes, the WAC 1308 comprises four registers, Registers 1-4, for storing power samples and user defined limits, a comparator 1312 for comparing the values of the samples and limits stored in the Registers 1-4, and a multiplexor (MUX) 1314 for controlling the operation of the WAC 1308.

In operation of the embodiment illustrated in FIG. 13A, three voltages Va, Vb, and Vc, which correspond to three voltage-in lines of a 3-phase system, are sampled by the main sampling system that conventionally meters the power for revenue calculations at $t_1$. The three voltages Va, Vb, and Vc, as illustrated in FIG. 13A, which are to be sampled in parallel with the main system at a sampling rate much faster than that required for the main sampling system, are filtered by a high-pass filter to distinguish a rapidly rising transient voltage (high dV/dT) or current (dI/dT).

After being filtered, the filtered voltages Va, Vb, and Vc are sent to the peak detectors 1302. The filtered voltages Va, Vb, and Vc are sampled by the peak detectors at rate much higher, e.g., about 5 KHz to about 20 MHz, than the rate used by the main system for revenue calculations, e.g., about 2 KHZ to about 10 KHz. For example, referring to FIG. 13C, corresponding to the time period A (the period between $t_1$ and $t_2$), the high-speed peak detectors 1302 capture 10 samples, before the main system takes its sample at $t_2$. The peaks captured at the fast sampling rates are then sent to the WAC and placed in Register 1. The samples taken at $t_1$ for each voltage-in line by the main system are placed in the WAC, specifically, in Register 4, as illustrated in FIGS. 13A and 13B.

If the peak detectors 1302 are high-speed analog peak detectors, then an analog to digital conversion is performed by the Analog/Digital Converters 1304 before the captured peaks from the first sampling rate are sent to the WAC and placed in Register 1.

Once the values captured by the peak detectors 1302 are placed in Register 1, the comparator 1312 compares the values in Register 1 to a predetermined threshold value stored in Register 2. The predetermined threshold value in Register 2 can either be determined when the meter is constructed or can be set by the monitor of the meter depending on how accurately the monitor and the user wish to monitor the high-speed power quality events. If the detected peak values stored in Register 1 are above the predetermined threshold (Th) in Register 2, then, the values in Register 1 are placed in Register 3. If it is determined that the values in Register 1 are below the predetermined threshold (Th), then, the values in Register 1 are disregarded and the value stored in Register 4, the normal sample taken at $t_1$, is placed in Register 3. The samples stored in Register 3, along with the time at which the samples were taken, are then stored in the memory 1310. The sample taken at $t_1$ remains in Register 4 until time $t_2$ when a new sample is placed in Register 4 to be used with high-speed samples at $t_2y$.

After all the samples taken by both systems are stored in memory 1310, the user can display the result of the monitoring. A display may be included in the power meter itself or may comprise a display screen such as a PC, PDA, or other electronic device, that has the ability to retrieve the information from the memory 1310. Some possible memory retrieval options are wirelessly sending the information, sending the information via telephone lines, or via the Internet. When using these alternative displays, the power meter includes the requisite communication components.

Figure 13C:
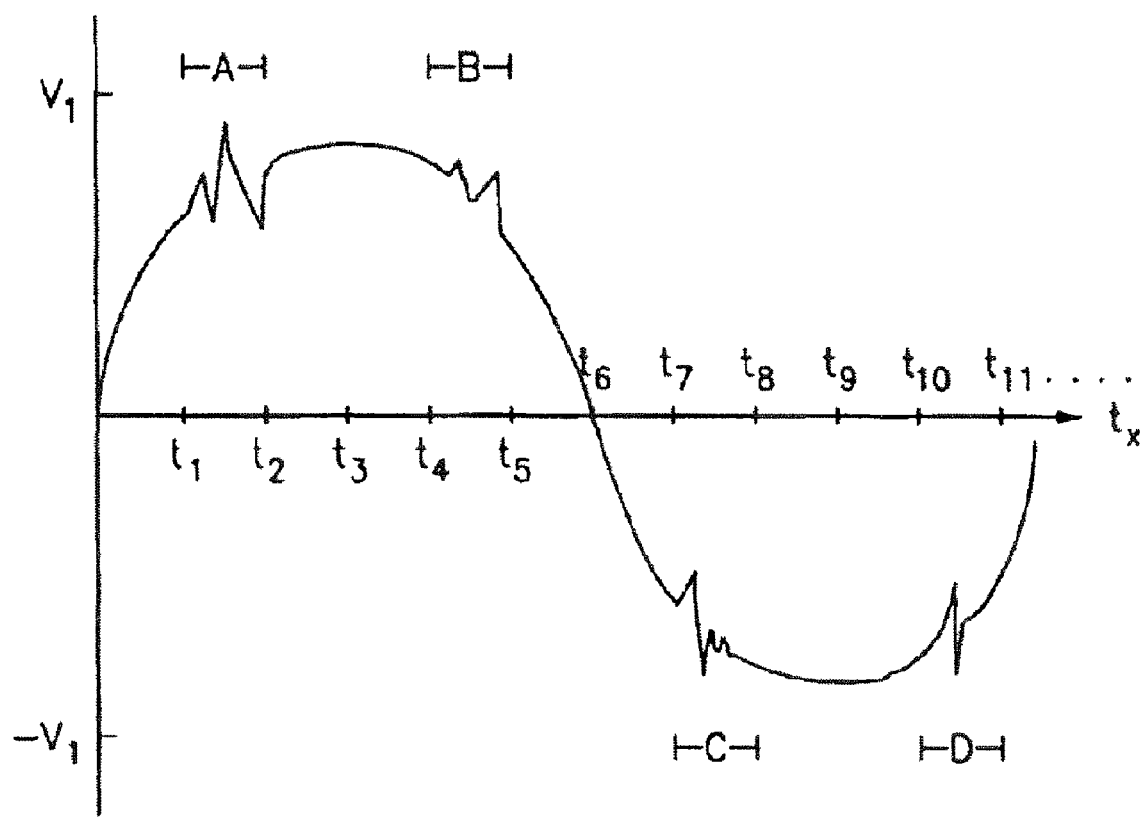
FIG. 13C illustrates the combined result of the consumption of power by a user for metering purposes at the first scanning rate and the high-speed power quality events at the second scanning rate as determined by the meter of FIGS. 13A and 13B.

FIG. 13C illustrates the combined result of the consumption of power by a user for metering purposes at a first scanning rate and the high-speed power quality events into a single wave form, better illustrating the actual power events as they occurred. As illustrated in FIG. 13C, the high-speed power quality events above the threshold are time synchronized by the MUX 1314, with the power metered resulting in a detailed graph of the actual power provided to the user.

Electrical device 100 is configured and dimensioned for installation using a standard ANSI C39.1 (4" round) or an IEC 92 mm DIN (Square) form.

Figure 9B:
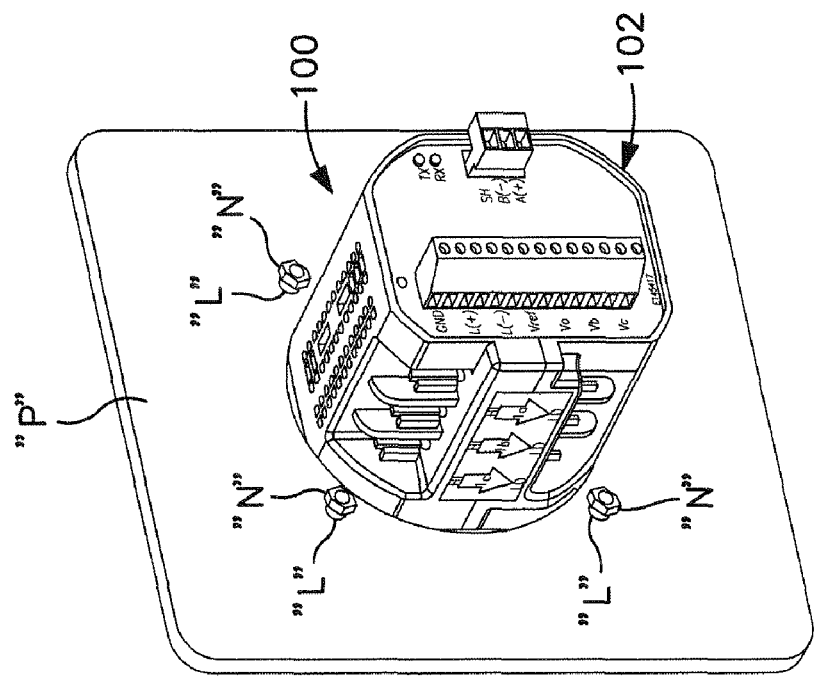
FIGS. 9A and 9B illustrate an ANSI installation of the electrical device of FIGS. 1-3.
Figure 9A:
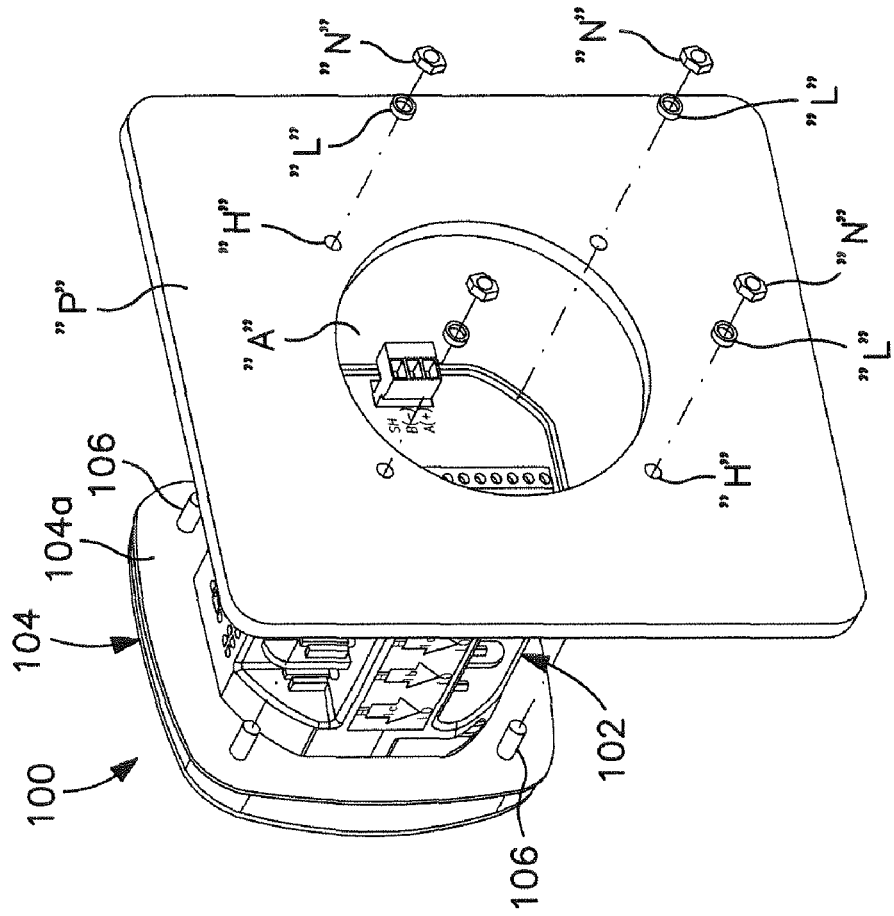

FIGS. 9A and 9B illustrate and describe a method of installing electrical device 100 according to ANSI standards. As seen in FIGS. 9A and 9B, face plate 104 includes mounting means in the form of a plurality of threaded rods 106 extending from a rear surface 104a thereof. Electrical device 100 is inserted into an opening or aperture "A" of panel "P" such that threaded rods 106 extend through holes "H" formed in panel "P". Electrical device 100 is secured to panel "P" by tightening a lock washer "L" and nut "N" onto each threaded rod 106. Preferably, a mounting gasket "G" is disposed in rear surface 104a of face plate 104 prior to the mounting of electrical device 100 to panel "P".

Figure 10B:
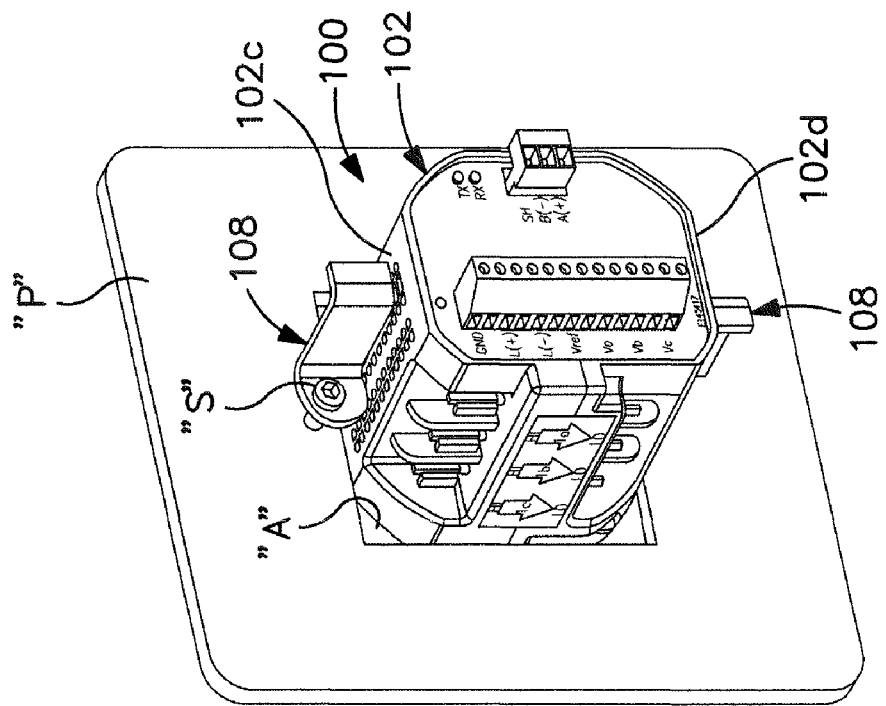
FIGS. 10A and 10B illustrate a DIN installation of the electrical device of FIGS. 1-3.
Figure 10A:
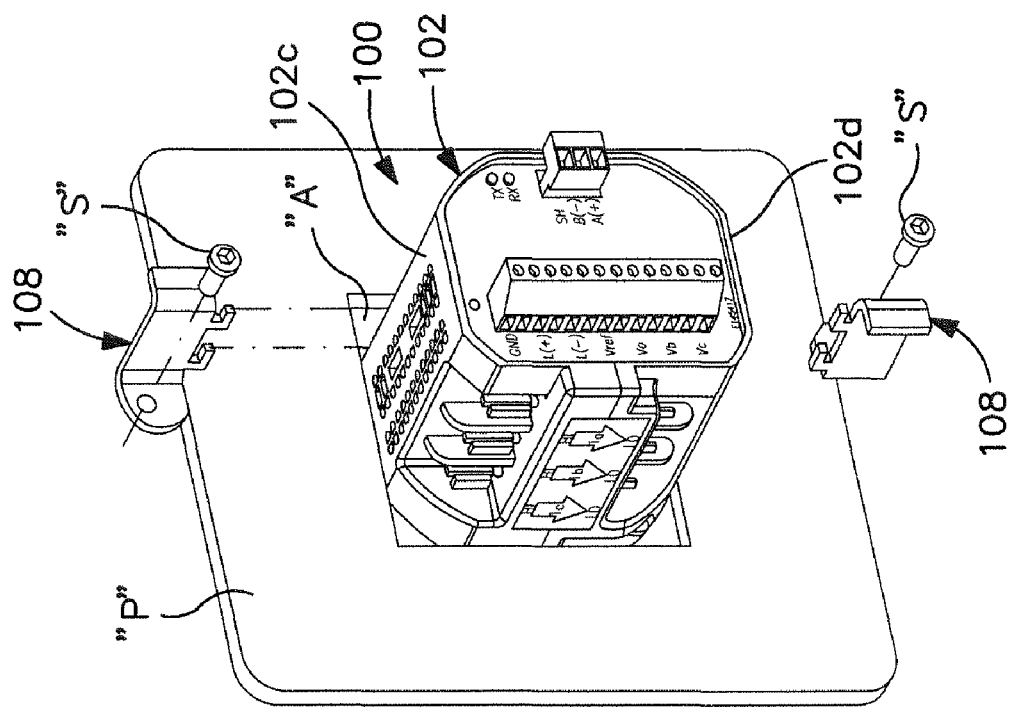

FIGS. 10A and 10B illustrate and describe a method of installing electrical device 100 according to DIN standards. As seen in FIGS. 10A and 10B, electrical device 100 is inserted into opening or aperture "A" of panel "P" and mounting means, in the form of mounting brackets 108, are operatively connected to top surface 102c and bottom surface 102d of housing 102. Electrical device 100 is then secured to panel "P" using screws "S" extending through mounting brackets 108 and engaging the surface of panel "P".

Turning back to FIG. 4, electrical device 100 may include a first interface or communication port 150 for connection to a master and/or slave device. Desirably, first communication port 150 is situated in rear surface 102b of housing 102. Electrical device 100 may also include a second interface or communication port 152 situated on face plate 104 (see FIG. 1).

While the disclosure has been particularly shown and described with reference to a preferred embodiment, it will be understood by those skilled in the art that various modifications in form and detail may be made therein without departing from the scope or spirit of the disclosure. Accordingly, modifications, such as those suggested above, but not limited thereto are to be considered within the scope of the presently disclosed electrical device.

What is claimed is:

1. An electrical power meter comprising:
a housing for containing electrical circuitry for measuring power usage therein, the electrical circuitry including a digital sampler configured for sampling at least one voltage waveform and at least one current waveform and at least one processor configured to execute a plurality of different tasks related to the sampled at least one voltage and current waveforms and running independently from one another in response to a plurality of concurrent request submitted by multiple users,
wherein the housing includes at least one voltage input and at least one current input coupled to the digital sampler, the at least one voltage input being disposed on a surface of the housing and the at least one current input being configured as at least one passage extending entirely through the housing, wherein the at least one passage is configured to receive at least one CT lead therethrough, and wherein said at least one CT lead extends through the at least one passage of the housing un-connected to any electrical component of said electrical circuitry for measuring power usage;

and a network interface configured to simultaneously provide the multiple users each with a result of a respective one of said plurality of different tasks.

2. The electrical power meter of claim 1, further comprising a memory coupled to the at least one processor for storing network protocol conversion algorithms.

3. The electrical power meter of claim 2, wherein the at least one processor performs at least one power calculation and converts at least one of the sampled voltage waveforms, the sampled current waveforms and the power calculation to at least one network protocol using one of the network protocol conversion algorithms, the at least one network protocol being provided through said network interface.

4. The electrical power meter of claim 3, wherein the network protocol is in accordance with Modbus Transmission Control Protocol (TCP).

5. The electrical power meter of claim 3, wherein the network protocol is in accordance with RS-485.

6. The electrical power meter of claim 3, wherein the network protocol is in accordance with an e-mail protocol.

7. The electrical power meter of claim 3, wherein the network protocol is in accordance with File Transfer Protocol (FTP).

8. The electrical power meter of claim 3, wherein the network protocol is in accordance with Dynamic Host Configuration Protocol (DHCP).

9. The electrical power meter of claim 1, wherein the plurality of different tasks include executing revenue calculations.

10. The electrical power meter of claim 1, further comprising an external device interface for connecting an external device to said electrical power meter, wherein said external device transmits packet data to said electrical power meter to be processed by the at least one processor and provided through said network interface.

11. The electrical power meter of claim 1, wherein the network interface is an Ethernet interface.

12. The electrical power meter of claim 1, wherein the network interface supports one of 100 base-T and 10 base-T communications.

13. The electrical power meter of claim 1, wherein the at least one processor includes a web server operative to provide data to the network interface in Hypertext Markup Language (HTML).

14. The electrical power meter of claim 1, wherein the at least one processor includes a web server operative to provide data to the network interface in Extensible Markup Language (XML) format.

15. The electrical power meter of claim 1, wherein the at least one processor is further configured to e-mail alarms in response to predefined conditions.

16. The electrical power meter of claim 1, further comprising a gateway interface for communicating to slave devices speaking a serial protocol, wherein the at least one processor is further operative to format the serial data received by slave devices and transmit the formatted data via the network interface.

17. The electrical power meter of claim 16, wherein the at least one processor's said formatting includes changing the protocol of the data collected from the slave devices.

18. The electrical power meter of claim 16, wherein the at least one processor's said formatting includes modifying the data collected from the slave device into an Ethernet protocol.

19. The electrical power meter of claim 16, wherein the at least one processor's said formatting includes modifying the data collected from the slave device into a different data type.

20. The electrical power meter of claim 16, wherein the at least one processor's said formatting includes modifying the data collected from the slave device into Hypertext Markup Language (HTML).

21. The electrical power meter of claim 16, wherein the at least one processor's said formatting includes modifying the data collected from the slave device into Extensible Markup Language (XML).

22. The electrical power meter of claim 16, wherein the at least one processor's said formatting includes modifying the data collected from the slave device into an e-mail message.

23. An electrical power meter comprising:

a housing for containing electrical circuitry for measuring power usage therein, the electrical circuitry including a digital sampler configured for sampling at least one voltage waveform and at least one current waveform and at least one processor configured to detect and record high-speed power quality events based on the sampled waveforms, wherein the housing includes at least one voltage input and at least one current input coupled to the digital sampler, the at least one voltage input being disposed on a surface of the housing and the at least one current input being configured as at least one passage extending entirely through the housing, wherein the at least one passage is configured to receive at least one CT lead therethrough, and wherein said at least one CT lead extends through the at least one passage of the housing un-connected to any electrical component of said electrical circuitry for measuring power usage.

24. The electrical power meter of claim 23, wherein the digital sampler samples the at least one voltage waveform and at least one current waveform at a first scanning rate, further comprising:

a plurality of digital high-speed peak detectors for detecting high-speed quality events of the power consumed by the user or provided by the provider at a second scanning rate, the second scanning rate being faster than the first scanning rate.

25. The electrical power meter of claim 24, wherein the first scanning rate is at least 120 Hz.

26. The electrical power meter of claim 24, wherein the first scanning rate is about 2 Hz to about 10 KHz.

27. The electrical power meter of claim 24, wherein the second scanning rate is at least 5 KHz.

28. The electrical power meter of claim 24, wherein the second scanning rate is about 5 KHz to about 20 MHz.

29. The electrical power meter of claim 24, wherein the first scanning rate is at least 120 Hz and the second scanning rate is at least 5 KHz.

30. The electrical power meter of claim 24, further comprising a wave analysis component for comparing the detected high-speed quality events to a predetermined threshold, storing the detected high-speed quality events in time synchronization with the sampled waveforms if the high-speed quality events detected are above the predetermined threshold in a memory, and disregarding the detected high-speed quality events if the detected high-speed quality events are below the predetermined threshold.

31. The electrical power meter of claim 30, wherein the memory stores the predetermined threshold, the sampled waveforms, the detected high-speed quality events, and a single waveform representation, to be displayed for a user.

32. The electrical power meter of claim 31, further comprising a multiplexor for combining the stored detected high-speed quality events in time synchronization with the sampled waveforms to display the sampled waveforms and the detected high-speed quality events in the single waveform representation.

33. The electrical power meter of claim 32, further comprising a display unit for displaying the contents of the memory.

34. The electrical power meter of claim 33, wherein the display is a separate unit capable of retrieving the contents of the memory.

35. The electrical power meter of claim 30, further comprising at least one high pass filter for filtering the high-speed quality events from the at least one voltage input and at least one current input before being detected by the digital high-speed peak detectors.

36. The electrical power meter of claim 30, further comprising at least one electrical isolator coupled between the at least one voltage input and current input and the wave analysis component.

37. The electrical power meter of claim 23, wherein the digital sampler samples the at least one voltage waveform and at least one current waveform at a first scanning rate, further comprising:
a plurality of analog high-speed peak detectors for detecting high-speed quality events at the at least one voltage input and the at least one current input at a second scanning rate, the second scanning rate being faster than the first scanning rate;
an analog/digital converter for converting analog signals into digital signals to perform calculations and comparisons; and
a wave analysis component for comparing the detected high-speed quality events to a predetermined threshold, storing the detected high-speed quality events in time synchronization with the monitored power metering parameters if the high-speed quality events detected are above the predetermined threshold in a memory, and disregarding the detected high-speed quality events if the detected high-speed quality events are below the predetermined threshold.

38. The electrical power meter of claim 37, wherein the memory stores the predetermined threshold, the sampled waveforms, the detected high-speed quality events, and a single waveform representation, to be displayed for a user.
a multiplexor for combining the stored detected high-speed quality events in time synchronization with the sampled waveforms to display the sampled waveforms and the detected high-speed quality events in the single waveform representation.

39. The electrical power meter of claim 38, further comprising a display unit for displaying the contents of the memory.

40. An electrical power meter comprising:
a housing for containing electrical circuitry for measuring power usage therein, the electrical circuitry including a digital sampler configured for sampling at least one voltage waveform and at least one current waveform and at least one processor configured to execute a plurality of different tasks related to the sampled at least one voltage and current waveforms and running independently from one another in response to a plurality of concurrent request submitted by multiple users,
wherein the housing includes at least one voltage input and at least one current input coupled to the digital sampler, the at least one voltage input being disposed on a surface of the housing and the at least one current input being configured as at least one passage extending entirely through the housing.

41. The electrical power meter of claim 40, further comprising a network interface configured to simultaneously provide the multiple users each with a result of a respective one of said plurality of different tasks.

42. The electrical power meter of claim 41, further comprising a memory coupled to the at least one processor for storing network protocol conversion algorithms.

43. The electrical power meter of claim 42, wherein the at least one processor performs at least one power calculation and converts at least one of the sampled voltage waveforms, the sampled current waveforms and the power calculation to at least one network protocol using one of the network protocol conversion algorithms, the at least one network protocol being provided through said network interface.

44. An electrical power meter comprising:
a housing for containing electrical circuitry for measuring power usage therein, the housing including at least one voltage input and at least one current input, the at least one current input being configured as at least one passage extending entirely through the housing; and
a face plate operatively supported on a front surface of the housing for mounting the housing in a panel,
wherein the at least one passage is disposed on a rear surface of the housing opposite the face plate.

45. The electrical power meter according to claim 44, wherein the face plate includes a plurality of indicators configured to indicate a percentage of load bar measured by the electrical power meter.

46. The electrical power meter according to claim 44, further comprising a communication interface disposed on the rear surface of the housing.

47. The electrical power meter according to claim 46, wherein the housing is configured for ANSI mounting.

48. The electrical power meter according to claim 46, wherein the housing is configured for DIN mounting.

49. The electrical power meter according to claim 46, wherein the communication interface is a network interface card.

50. The electrical power meter according to claim 46, wherein the communication interface is an Ethernet interface.

51. The electrical power meter according to claim 46, wherein the communication interface is an Transmission Control Protocol/Internet Protocol (TCP/IP) interface.

52. The electrical power meter according to claim 46, wherein the communication interface operates in accordance with Modbus Transmission Control Protocol (TCP).

53. The electrical power meter according to claim 46, wherein the communication interface operates in accordance with RS-485.

54. The electrical power meter according to claim 46, wherein the communication interface operates in accordance with an e-mail protocol.

55. The electrical power meter according to claim 46, wherein the communication interface operates in accordance with File Transfer Protocol (FTP).

56. The electrical power meter according to claim 46, wherein the communication interface operates in accordance with Dynamic Host Configuration Protocol (DHCP).

57. The electrical power meter of claim 44, further comprising an external device interface for connecting an external device to said electrical power meter.

* * * * *